(12) United States Patent
Yoshizumi et al.

(10) Patent No.: US 8,389,312 B2
(45) Date of Patent: Mar. 5, 2013

(54) GROUP-III NITRIDE SEMICONDUCTOR LASER DEVICE, AND METHOD OF FABRICATING GROUP-III NITRIDE SEMICONDUCTOR LASER DEVICE

(75) Inventors: Yusuke Yoshizumi, Itami (JP); Shimpei Takagi, Osaka (JP); Takatoshi Ikegami, Itami (JP); Masaki Ueno, Itami (JP); Koji Katayama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/367,846

(22) Filed: Feb. 7, 2012

(65) Prior Publication Data
US 2012/0135554 A1 May 31, 2012

Related U.S. Application Data

(62) Division of application No. 12/837,184, filed on Jul. 15, 2010, now Pat. No. 8,265,113.

(30) Foreign Application Priority Data

Dec. 25, 2009 (JP) .............................. P2009-295574

(51) Int. Cl.
*H01L 21/00* (2006.01)
(52) U.S. Cl. .................. 438/33; 372/44.011; 372/45.01; 257/E21.238; 257/E21.599
(58) Field of Classification Search .................... 438/33, 438/42, 46; 372/44.011, 45.01; 257/E21.085, 257/E21.238, E21.599
See application file for complete search history.

(56) References Cited

U.S. PATENT DOCUMENTS

| | | | |
|---|---|---|---|
| 6,596,079 B1 * | 7/2003 | Vaudo et al. | 117/97 |
| 6,653,663 B2 | 11/2003 | Ishida | |
| 6,756,562 B1 * | 6/2004 | Kurosawa et al. | 219/121.67 |
| 7,501,667 B2 | 3/2009 | Hasegawa et al. | |
| 7,933,303 B2 | 4/2011 | Yoshizumi et al. | |
| 8,071,405 B2 * | 12/2011 | Takagi et al. | 438/33 |
| 8,076,167 B2 * | 12/2011 | Takagi et al. | 438/33 |

(Continued)

FOREIGN PATENT DOCUMENTS

| | | |
|---|---|---|
| JP | 2001-230497 A | 8/2001 |
| JP | 2005-353690 A | 12/2005 |

(Continued)

OTHER PUBLICATIONS

Tyagi et al., "Semipolar (10-1-1) InGaN/GaN Laser Diodes on Bulk GaN Substrates," Japanese Journal of Applied Physics vol. 46, No. 19, pp. L444-L445 (2007).

(Continued)

*Primary Examiner* — David Vu
*Assistant Examiner* — Earl Taylor
(74) *Attorney, Agent, or Firm* — Venable LLP; Michael A. Santori; Tamatane J. Aga

(57) ABSTRACT

A method of fabricating a group-III nitride semiconductor laser device includes: preparing a substrate of a hexagonal group-III nitride semiconductor, where the substrate has a semipolar primary surface; forming a substrate product having a laser structure, an anode electrode and a cathode electrode, where the laser structure includes the substrate and a semiconductor region, and where the semiconductor region is formed on the semipolar primary surface; scribing a first surface of the substrate product in part in a direction of the a-axis of the hexagonal group-III nitride semiconductor; and carrying out breakup of the substrate product by press against a second surface of the substrate product, to form another substrate product and a laser bar.

8 Claims, 24 Drawing Sheets

U.S. PATENT DOCUMENTS

| | | | |
|---|---|---|---|
| 8,105,857 B2 * | 1/2012 | Takagi et al. | 438/33 |
| 2001/0030328 A1 | 10/2001 | Ishida | |
| 2003/0132508 A1 | 7/2003 | Ishida | |
| 2003/0205783 A1 | 11/2003 | Ishida | |
| 2004/0191942 A1 * | 9/2004 | Kawakami et al. | 438/33 |
| 2005/0023260 A1 * | 2/2005 | Takyu et al. | 219/121.67 |
| 2005/0269584 A1 | 12/2005 | Hasegawa et al. | |
| 2007/0093073 A1 * | 4/2007 | Farrell et al. | 438/763 |
| 2008/0056319 A1 * | 3/2008 | Ohno | 372/43.01 |
| 2008/0230766 A1 | 9/2008 | Okamoto et al. | |
| 2009/0059983 A1 | 3/2009 | Hasegawa et al. | |
| 2009/0086778 A1 * | 4/2009 | Kameyama et al. | 372/44.01 |
| 2009/0098712 A1 * | 4/2009 | Taguchi et al. | 438/462 |
| 2009/0262771 A1 * | 10/2009 | Inoue et al. | 372/45.01 |
| 2009/0268768 A1 | 10/2009 | Ueno et al. | |
| 2010/0080001 A1 | 4/2010 | Kunoh et al. | |
| 2010/0096615 A1 * | 4/2010 | Okamoto et al. | 257/13 |
| 2010/0230690 A1 | 9/2010 | Kyono et al. | |
| 2010/0322276 A1 * | 12/2010 | Yoshizumi et al. | 372/44.011 |
| 2011/0064100 A1 * | 3/2011 | Raring et al. | 372/44.011 |
| 2011/0128983 A1 * | 6/2011 | Takagi et al. | 372/45.01 |
| 2011/0158275 A1 * | 6/2011 | Yoshizumi et al. | 372/44.011 |
| 2011/0158276 A1 * | 6/2011 | Takagi et al. | 372/44.011 |
| 2011/0158277 A1 * | 6/2011 | Yoshizumi et al. | 372/44.011 |
| 2011/0164638 A1 * | 7/2011 | Yoshizumi et al. | 372/45.01 |
| 2011/0176569 A1 * | 7/2011 | Takagi et al. | 372/45.01 |
| 2011/0228804 A1 * | 9/2011 | Yoshizumi et al. | 372/44.011 |
| 2011/0299560 A1 * | 12/2011 | Takagi et al. | 372/44.011 |
| 2011/0300653 A1 * | 12/2011 | Takagi et al. | 438/33 |

FOREIGN PATENT DOCUMENTS

| | | |
|---|---|---|
| JP | 2007-184353 A | 7/2007 |
| JP | 2008-187044 A | 8/2008 |
| JP | 2008-235804 A | 10/2008 |
| JP | 2009-071127 A | 4/2009 |
| JP | 2009-081336 A | 4/2009 |
| JP | 2009-235804 A | 10/2009 |
| JP | 2010-109331 | 5/2010 |
| JP | 4475357 B1 | 6/2010 |

OTHER PUBLICATIONS

Akasaki et al. "Group III Nitride Semiconductor," Baifuukan, 1999 p. 264.

* cited by examiner

Fig.3
(a)
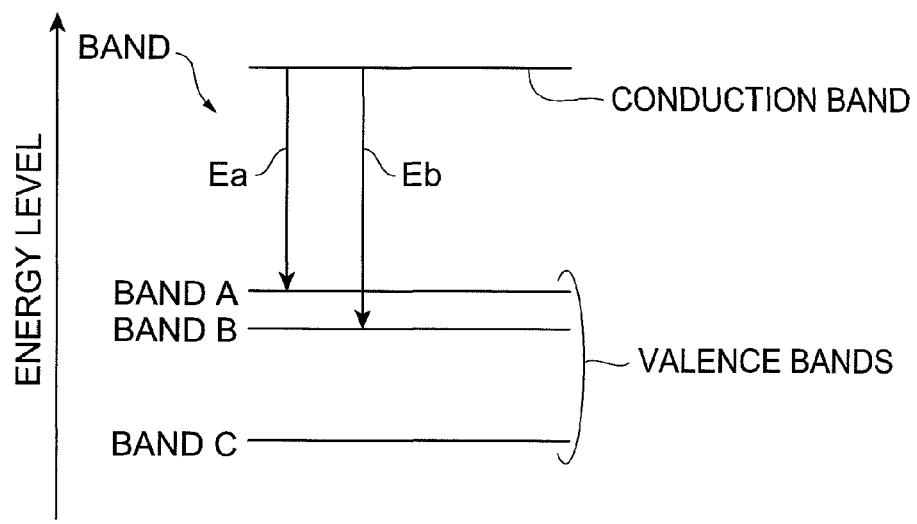
(b)
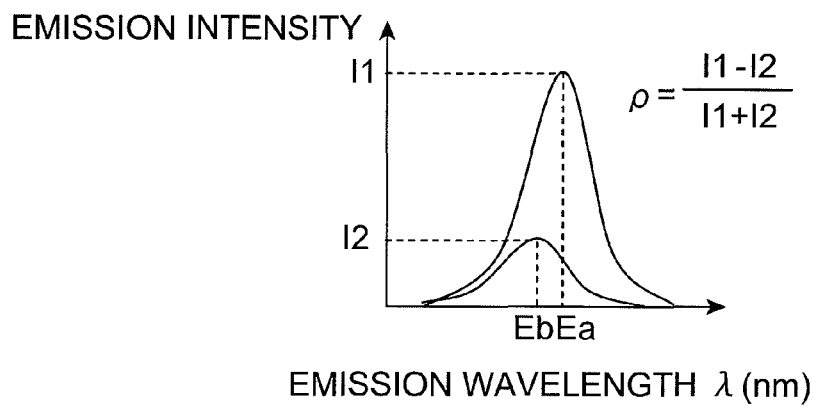

*Fig.8* (a)
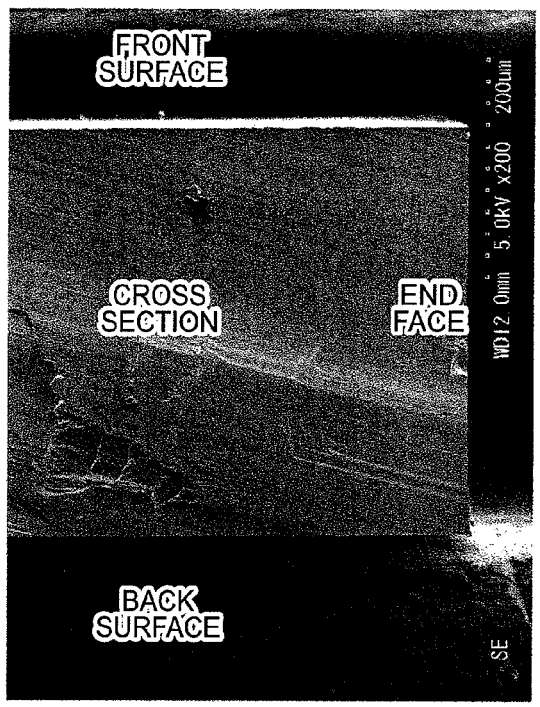
(b)
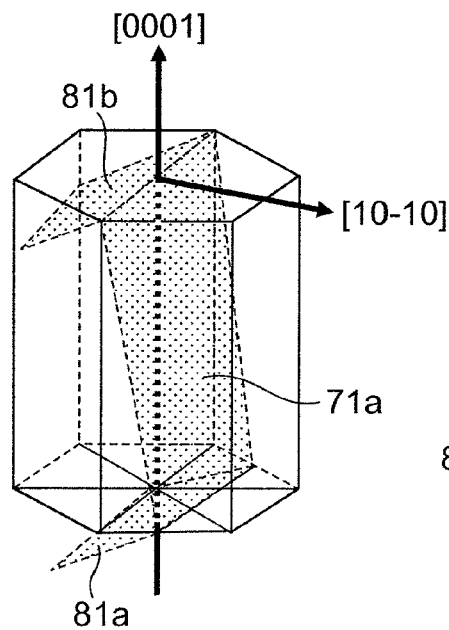
(c)
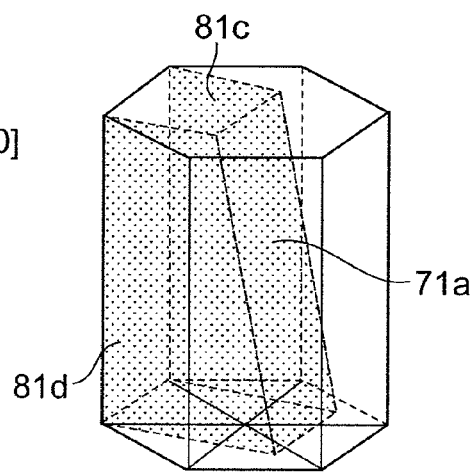

*Fig.14*

| HEXAGONAL GaN | | | | | | | | | | |
|---|---|---|---|---|---|---|---|---|---|---|
| a | c | h1 | k1 | l1 | h2 | k2 | l2 | cos θ | Arccos(rad) | (deg) |
| 3.189 | 5.185 | -1 | 0 | 1 | 2 | 0 | 1 | -0.7 | 2.4 | 137.05 |
| 3.189 | 5.185 | -1 | 0 | 2 | 2 | 0 | 1 | -0.5 | 2.1 | 118.28 |
| 3.189 | 5.185 | -1 | 0 | 3 | 2 | 0 | 1 | -0.3 | 1.9 | 107.13 |
| 3.189 | 5.185 | -1 | 0 | 4 | 2 | 0 | 1 | -0.2 | 1.7 | 100.23 |
| 3.189 | 5.185 | -1 | 0 | 5 | 2 | 0 | 1 | -0.1 | 1.7 | 95.67 |
| 3.189 | 5.185 | -1 | 0 | 6 | 2 | 0 | 1 | 0.0 | 1.6 | 92.46 |
| 3.189 | 5.185 | -1 | 0 | 7 | 2 | 0 | 1 | 0.0 | 1.6 | 90.10 |
| 3.189 | 5.185 | -1 | 0 | 8 | 2 | 0 | 1 | 0.0 | 1.5 | 88.29 |
| 3.189 | 5.185 | -1 | 0 | 9 | 2 | 0 | 1 | 0.1 | 1.5 | 86.87 |
| 3.189 | 5.185 | -1 | 0 | 10 | 2 | 0 | 1 | 0.1 | 1.5 | 85.72 |
| 3.189 | 5.185 | -2 | 0 | 1 | 2 | 0 | 1 | -0.9 | 2.6 | 150.17 |
| 3.189 | 5.185 | -2 | 0 | 2 | 2 | 0 | 1 | -0.7 | 2.4 | 137.05 |
| 3.189 | 5.185 | -2 | 0 | 3 | 2 | 0 | 1 | -0.6 | 2.2 | 126.46 |
| 3.189 | 5.185 | -2 | 0 | 4 | 2 | 0 | 1 | -0.5 | 2.1 | 118.28 |
| 3.189 | 5.185 | -2 | 0 | 5 | 2 | 0 | 1 | -0.4 | 2.0 | 111.99 |
| 3.189 | 5.185 | -2 | 0 | 6 | 2 | 0 | 1 | -0.3 | 1.9 | 107.13 |
| 3.189 | 5.185 | -2 | 0 | 7 | 2 | 0 | 1 | -0.2 | 1.8 | 103.30 |
| 3.189 | 5.185 | -2 | 0 | 8 | 2 | 0 | 1 | -0.2 | 1.7 | 100.23 |
| 3.189 | 5.185 | -2 | 0 | 9 | 2 | 0 | 1 | -0.1 | 1.7 | 97.73 |
| 3.189 | 5.185 | -2 | 0 | 10 | 2 | 0 | 1 | -0.1 | 1.7 | 95.67 |
| 3.189 | 5.185 | -3 | 0 | 1 | 2 | 0 | 1 | -0.9 | 2.7 | 155.02 |
| 3.189 | 5.185 | -3 | 0 | 2 | 2 | 0 | 1 | -0.8 | 2.5 | 145.54 |
| 3.189 | 5.185 | -3 | 0 | 3 | 2 | 0 | 1 | -0.7 | 2.4 | 137.05 |
| 3.189 | 5.185 | -3 | 0 | 4 | 2 | 0 | 1 | -0.6 | 2.3 | 129.71 |
| 3.189 | 5.185 | -3 | 0 | 5 | 2 | 0 | 1 | -0.6 | 2.2 | 123.49 |
| 3.189 | 5.185 | -3 | 0 | 6 | 2 | 0 | 1 | -0.5 | 2.1 | 118.28 |
| 3.189 | 5.185 | -3 | 0 | 7 | 2 | 0 | 1 | -0.4 | 2.0 | 113.91 |
| 3.189 | 5.185 | -3 | 0 | 8 | 2 | 0 | 1 | -0.3 | 1.9 | 110.23 |
| 3.189 | 5.185 | -3 | 0 | 9 | 2 | 0 | 1 | -0.3 | 1.9 | 107.13 |
| 3.189 | 5.185 | -3 | 0 | 10 | 2 | 0 | 1 | -0.2 | 1.8 | 104.48 |

Left axis label: (PLANE INDICES OF PLANES PERPENDICULAR TO (20-21))

→ (-1016) PLANE
→ (-1017) PLANE
→ (-1018) PLANE

Fig.16
(a)
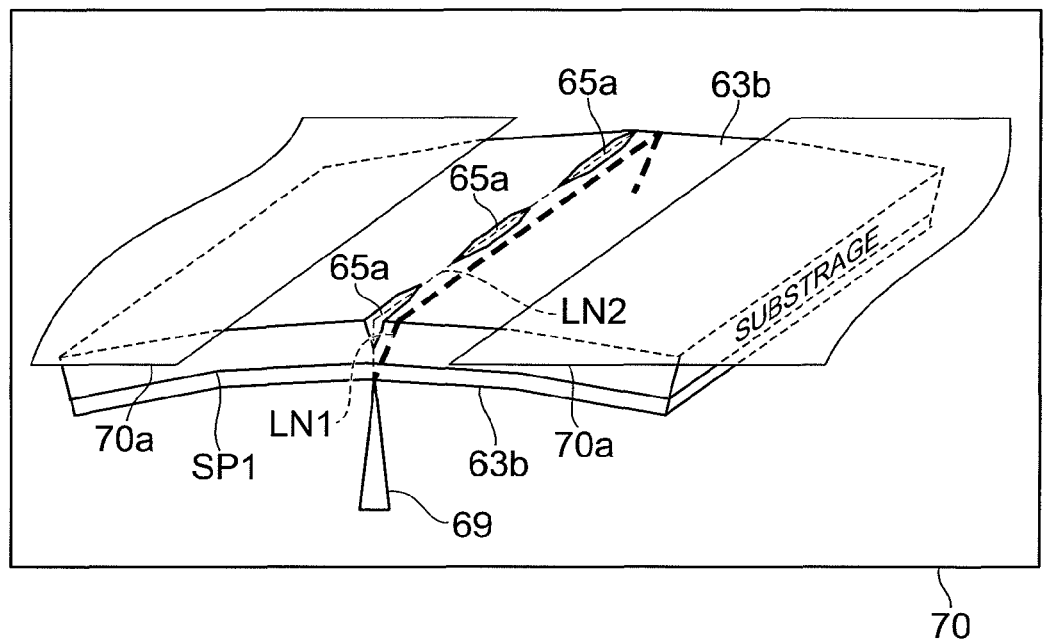
(b)
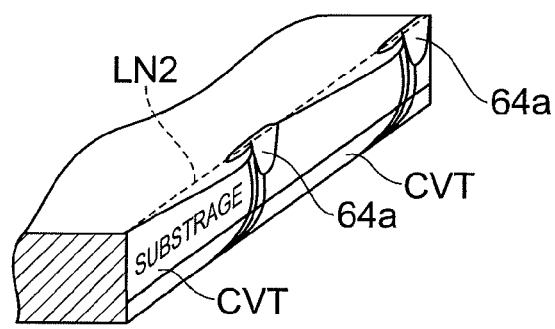

GROUP-III NITRIDE SEMICONDUCTOR LASER DEVICE, AND METHOD OF FABRICATING GROUP-III NITRIDE SEMICONDUCTOR LASER DEVICE

CROSS-REFERENCE TO RELATED APPLICATIONS

This application is a Divisional of U.S. patent application Ser. No. 12/837,184, filed Jul. 15, 2010, which claims the benefit of Japan Patent Application No. 2009-295574, filed Dec. 25, 2009, both of which are incorporated herein by reference in their entirety.

BACKGROUND OF THE INVENTION

1. Field of the Invention

The present invention relates to a III-nitride semiconductor laser device, and a method of fabricating the III-nitride semiconductor laser device.

2. Related Background Art

Patent Literature 1 discloses a laser device. When a primary surface of a substrate is a face inclined at 28.1 degrees from a {0001} plane toward a direction equivalent to the [1-100] direction, a secondary cleaved facet is a {11-20} planes perpendicular to both of the primary surface and optical cavity faces, and the laser device is of a rectangular parallelepiped shape.

Patent Literature 2 discloses a nitride semiconductor device. The back surface of the substrate is polished for cleavage to reduce the total thickness to about 100 μm. A dielectric multilayer film is deposited on cleaved facets.

Patent Literature 3 discloses a nitride-based compound semiconductor device. The substrate used for the nitride-based compound semiconductor device is comprised of a nitride-based compound semiconductor with the threading dislocation density of not more than $3\times10^6$ cm$^{-2}$ and the in-plane threading dislocation density is substantially uniform.

Patent Literature 4 discloses a nitride-based semiconductor laser device. In the nitride-based semiconductor laser device, cleaved facets are formed as described below. With respect to recesses which are made by etching and extends from layers for the semiconductor laser device to an n-type GaN substrate, scribed grooves are formed using a laser scriber and arranged like a dashed line (at intervals of about 40 μm) in a direction orthogonal to an extending direction of ridge portions, while avoiding projections made during the etching of cavity faces on the n-type GaN substrate. Then the wafer is cleaved at positions of the scribed grooves. On this occasion, each of regions without the scribed grooves, e.g., each projection, is cleaved from the adjacent scribed grooves as an origin. As a result, device separation faces are formed as a cleaved facet of a (0001) plane of the n-type GaN substrate.

Patent Literature 5 discloses a light emitting device. The light emitting device is able to readily emit light at a long wavelength, without deterioration of luminous efficiency in its light emitting layer.

Patent Literature 6 discloses a nitride semiconductor laser. In the nitride semiconductor laser, a nitride semiconductor laser laminate including a light emitting layer is formed on the primary surface of a substrate. An end faces for an optical cavity is formed in the end of a region including the light emitting layer of the nitride semiconductor laser laminate, and extends in a direction substantially perpendicular to the primary surface of the substrate. A device separation face is made of a cleaved surface, and extends with at an inclination angle to the cavity planes.

Non-patent Literature 1 discloses a semiconductor laser, formed on a semipolar (10-11) plane, in which a waveguide extends in an off-axis direction and in which mirrors for an optical cavity are made by reactive ion etching. Further, Non-patent Literature 2 discloses angle of the laser waveguide.

Patent Literature 1: Japanese Patent Application Laid-open No. 2001-230497
Patent Literature 2: Japanese Patent Application Laid-open No. 2005-353690
Patent Literature 3: Japanese Patent Application Laid-open No. 2007-184353
Patent Literature 4: Japanese Patent Application Laid-open No. 2009-081336
Patent Literature 5: Japanese Patent Application Laid-open No. 2008-235804
Patent Literature 6: Japanese Patent Application Laid-open No. 2009-081336
Non-patent Literature 1: Jpn. J. Appl. Phys. Vol. 10 (2007) L444
Non-patent Literature 2: AKASAKI Isamu, Group III nitride semiconductor, Baifuukan, 1999, pp 264

SUMMARY OF THE INVENTION

The band structure of a gallium nitride-based semiconductor has some possible transitions capable of lasing. According to Inventors' knowledge, it is considered that in the III-nitride semiconductor laser device using the semipolar-plane support base the c-axis of which is inclined toward the m-axis, the threshold current can be lowered when the laser waveguide extends along a plane defined by the c-axis and the m-axis. When the laser waveguide extends in this orientation, a mode with the smallest transition energy (the difference between conduction band energy and valence band energy) among the possible transitions becomes capable of lasing; when this mode becomes capable of lasing, the threshold current can be reduced.

However, this orientation of the laser waveguide does not allow use of the conventional cleaved facets such as c-planes, a-planes, or m-planes for the cavity mirrors. For this reason, the cavity mirrors have been made heretofore by forming dry-etched facets of semiconductor layers by reactive ion etching (RIE). What is desired is improvement in the cavity mirrors formed by RIE, in terms of perpendicularity to the laser waveguide, flatness of the dry-etched facets, or ion damage. It becomes a heavy burden to derive process conditions for obtaining good dry-etched facets in the current technical level.

In the fabrication of a III-nitride semiconductor laser device using a c-plane, when a cavity mirror is formed using a conventional cleavage, the end faces are made by forming scribed grooves on the epi-side of thin films and applying the pressing force to the back side of the substrate using a blade to form cleavage facets. As far as the inventors know, in the III-nitride semiconductor laser device formed on the semipolar plane, no one has succeeded heretofore in achieving both of the laser waveguide extending in the inclination direction (off-axis direction) of the c-axis and the end faces for cavity mirrors formed without use of dry etching.

However, as described above, where the laser waveguide is directed so as to extend in the inclination direction (off-axis direction) of the c-axis, the cavity mirrors cannot be produced by making use of the conventional cleaved facets. According to Inventors' knowledge, end faces different from cleaved facets can be used as the cavity mirrors in the III-nitride semiconductor laser devices using a substrate having a semipolar surface the c-axis of which is inclined toward the m-axis. The applicant filed a Japanese patent application (Japanese Patent Application No. 2009-144442) related to the III-nitride semiconductor laser device including fractured faces for the optical cavity.

In the semiconductor laser using end faces different form cleavage facets for an optical cavity, light returning to the semiconductor laser has a great influence on lasing characteristics of the semiconductor laser, and makes the operation of the semiconductor laser instable. This requires a module implementing a nitride semiconductor laser to have an optical isolator therein. The addition of the optical isolator increases the cost of the module. Returning components are created by optical parts (such as lens, filter, and mirror) when a laser beam from the nitride semiconductor laser passes therethrough. These return components return to the waveguide of the nitride semiconductor laser and make the nitride semiconductor laser instable.

According to the inventors' experiments, most of the returning components enters the nitride semiconductor laser through the end face of the substrate, not the end face of the active layer. Eliminating the return components that enter the end face of the substrate end reduces their influence on the nitride semiconductor laser.

In Patent Literature 6, the end faces for the optical cavity are formed by dry-etching, and the substrate is cleaved to form a c-plane end face thereof. This method and structure need both a dry-etching process and a cleavage process in the fabrication of the nitride semiconductor laser. Since the cleaved facet is used, an angle on the substrate end of a cleaved facet is defined on a plane defined by a normal axis of the cleaved facet in the substrate end and a normal axis of the primary surface of the substrate.

It is an object to provide a III-nitride semiconductor laser device, including an optical cavity which can reduce the effect of disturbance that return light causes, on a semipolar plane of a support base inclined from the c-axis toward the m-axis of a hexagonal III-nitride, and to provide a method for fabricating the III-nitride semiconductor laser device.

A III-nitride semiconductor laser device according to an aspect of the present invention comprises: (a) a laser structure including a support base and a semiconductor region, the support base being comprised of a hexagonal III-nitride semiconductor and having a semipolar primary surface, and the semiconductor region being provided on the semipolar primary surface of the support base; and (b) an electrode provided on the semiconductor region of the laser structure. The semiconductor region comprises a first cladding layer comprised of a first conductivity type GaN-based semiconductor, a second cladding layer is comprised of a second conductivity type GaN-based semiconductor, and an active layer provided between the first cladding layer and the second cladding layer. The first cladding layer, the second cladding layer, and the active layer are arranged along an axis normal to the semipolar primary surface. The active layer comprises a GaN-based semiconductor layer. A c-axis of the hexagonal III-nitride semiconductor of the support base is inclined at an angle CALPHA with respect to the normal axis toward an m-axis of the hexagonal III-nitride semiconductor. The laser structure comprises first and second fractured faces, the first and second fractured faces intersect with an m-n plane defined by the m-axis of the hexagonal III-nitride semiconductor and the normal axis. A laser cavity of the III-nitride semiconductor laser device comprises the first and second fractured faces. The laser structure comprises first and second surfaces, and the first surface being opposite to the second surface. Each of the first and second fractured faces extends from an edge of the first surface to an edge of the second surface. The angle is in one of a range of not less than 45 degrees and not more than 80 degrees and a range of not less than 100 degrees and not more than 135 degrees. The laser structure comprises a laser waveguide on the semipolar primary surface of the support base, the laser waveguide extends in a direction of a waveguide vector, and the waveguide vector extends in a direction from one of to another of the first and second fractured faces. The first fractured face makes an angle β with a reference plane perpendicular to the waveguide vector in a first plane, the first plane is perpendicular to the m-n plane, and the angle β is defined on an end face of the support base in the first fractured face. The first fractured face makes an angle α with a reference plane perpendicular to the waveguide vector in a second plane, the second plane is perpendicular to the m-n plane, and the angle α is defined on an end face of the active layer in the first fractured face. The angle α is different from the angle β, a sign of the angle α is the same as that of the angle β, and a difference between the angle α and the angle β being not less than 0.1 degrees.

In this III-nitride semiconductor laser device, because the first and second fractured faces that form the laser cavity intersect with the m-n plane defined by the normal axis and the m-axis of the hexagonal III-nitride semiconductor, it is feasible to provide a laser waveguide extending in a direction of a line of intersection between the m-n plane and the semipolar surface. When the angle is in the range of less than 45 degrees or in the range of more than 135 degrees, end faces made by press are highly likely to be comprised of m-planes. When the angle is in the range of more than 80 degrees and less than 100 degrees, it may result in failing to achieve desired flatness and perpendicularity.

Since the first fractured face is different from a cleaved facet, the first fractured face makes an angle β with the above reference plane (the plane perpendicular to the waveguide vector) on the end face of the support base and makes an angle α with the above reference plane on an end face of the active layer in the first fractured face. The above fractured face is composed of a curved surface rather than a planar surface, and in the curved surface is provided such that the angle β is not less than 0.1 degrees. Since the above fractured face has the inclination angles defined to the above reference plane, this fractured face can reduce the effect of disturbance due to return light that enters the fractured face (the end faces of the active layer and the support base).

In the III-nitride semiconductor laser device according to the one aspect of the present invention, the angle β is greater than that of the angle α. The III-nitride semiconductor laser device can reduce the quantity of return light that enters the substrate through the end face of the substrate, and can decrease the angle α on the end face of the active layer. In the III-nitride semiconductor laser device according to the present invention, the waveguide vector makes an angle of not less than 0.1 degrees with a normal vector of an a-n plane defined by the normal axis and an a-axis of the hexagonal III-nitride semiconductor. In the III-nitride semiconductor laser device, the inclination of the laser waveguide with respect to the normal vector of the a-n plane increase the resistance to the influence of disturbance due to return light. In the III-nitride semiconductor laser device according to the present invention, the angle α is not more than 0.5 degrees. When the angle α is too large, the lasing characteristics is reduced.

In the III-nitride semiconductor laser device according to the present invention, a thickness of the support base is preferably not more than 400 μm. This III-nitride semiconductor laser device is suitable for obtaining an excellent-quality fractured face for the laser cavity.

In the III-nitride semiconductor laser device according to the present invention, more preferably, the thickness of the support base is not less than 50 μm and not more than 100 μm. When the thickness is not less than 50 μm, the handling becomes easier and production yield becomes higher. When the thickness is not more than 100 μm, it is more suitable for obtaining an excellent-quality fractured face for the laser cavity.

In the III-nitride semiconductor laser device according to the present invention, laser light from the active layer is polarized in a direction of the a-axis of the hexagonal III-nitride semiconductor. In this III-nitride semiconductor laser device, a band transition enabling for achievement of a low threshold current has polarized nature.

In the III-nitride semiconductor laser device according to the present invention, light in the LED mode in the III-nitride semiconductor laser device includes a polarization component I1 in a direction of the a-axis of the hexagonal III-nitride semiconductor, and a polarization component I2 in a projected direction of the c-axis of the hexagonal III-nitride semiconductor onto the primary surface, and the polarization component I1 is greater than the polarization component I2. This III-nitride semiconductor laser device can emit laser light with the laser cavity in a mode with large emission intensity in the LED mode.

In the III-nitride semiconductor laser device according to the present invention, more preferably, the angle between the normal axis and the c-axis of the hexagonal III-nitride semiconductor is in the range of not less than 63 degrees and not more than 80 degrees or in the range of not less than 100 degrees and not more than 117 degrees.

In this III-nitride semiconductor laser device, when the angle is in the range of not less than 63 degrees and not more than 80 degrees or in the range of not less than 100 degrees and not more than 117 degrees, end faces made by press are highly likely to be faces nearly perpendicular to the primary surface of the substrate. When the angle is in the range of more than 80 degrees and less than 100 degrees, it may result in failing to achieve desired flatness and perpendicularity.

In the III-nitride semiconductor laser device according to the present invention, preferably, the semipolar primary surface is one of a {20-21} plane, a {10-11} plane, a {20-2-1} plane, and a {10-1-1} plane.

This III-nitride semiconductor laser device allows for provision of first and second end faces on these typical semipolar planes, and the first and second end faces have flatness and perpendicularity enough to construct the laser cavity of the III-nitride semiconductor laser device.

In the III-nitride semiconductor laser device according to the present invention, the semipolar primary surface also suitably applicable is a surface with a slight slant in the range of not less than −4 degrees and not more than +4 degrees with respect to any one semipolar plane of a {20-21} plane, a {10-11} plane, a {20-2-1} plane, and a {10-1-1} plane, toward an m-plane.

This III-nitride semiconductor laser device allows for provision of the first and second end faces on the slight slant surface from these typical semipolar planes, and the first and second end faces have flatness and perpendicularity enough to construct the laser cavity of the III-nitride semiconductor laser device.

In the III-nitride semiconductor laser device according to the present invention, preferably, a stacking fault density of the support base is not more than $1 \times 10^4$ cm$^{-1}$.

In this III-nitride semiconductor laser device, because the stacking fault density is not more than $1 \times 10^4$ cm$^{-1}$, the flatness and/or perpendicularity of the fractured faces is less likely to vary because of a certain accidental reason.

In the III-nitride semiconductor laser device according to the present invention, the support base can be comprised of any one of GaN, AlGaN, AlN, InGaN, and InAlGaN.

In this III-nitride semiconductor laser device, when the substrate used is made of one of these GaN-based semiconductors, it becomes feasible to obtain the first and second end faces applicable to the cavity. Use of an AlN substrate or AlGaN substrate allows for increase in degree of polarization and enhancement of optical confinement by virtue of low refractive index. Use of an InGaN substrate allows for decrease in lattice mismatch rate between the substrate and the light emitting layer and improvement in crystal quality.

The III-nitride semiconductor laser device according to the present invention can further comprise a dielectric multilayer film provided on at least one of the first and second fractured faces.

In this III-nitride semiconductor laser device, an end face coat is also applicable to the fractured faces. The end face coat allows for adjustment of reflectance.

In the III-nitride semiconductor laser device according to the present invention, the active layer can include a quantum well structure provided so as to generate light at a wavelength of not less than 360 nm and not more than 600 nm. Since this III-nitride semiconductor laser device makes use of the semipolar plane, the resultant device is the III-nitride semiconductor laser device making efficient use of polarization in the LED mode and achieves a low threshold current.

In the III-nitride semiconductor laser device according to the present invention, more preferably, the active layer includes a quantum well structure provided so as to generate light at a wavelength of not less than 430 nm and not more than 550 nm. Since this III-nitride semiconductor laser device makes use of the semipolar plane, it allows for increase in quantum efficiency through piezoelectric field decrease and improvement in crystal quality of the light emitting layer region and it is thus suitable for generation of light at the wavelength of not less than 430 nm and not more than 550 nm.

In the III-nitride semiconductor laser device according to the present invention, an end face of the support base and an end face of the semiconductor region are exposed in each of the first and second fractured faces, and an angle between the end face of the semiconductor region in the active layer and a reference plane perpendicular to the m-axis of the support base of the hexagonal nitride semiconductor is in the range of not less than (CALPHA−5) degrees and not more than (CALPHA+5) degrees on a first plane defined by the c-axis and the m-axis of the III-nitride semiconductor.

This III-nitride semiconductor laser device has the end faces satisfying the foregoing perpendicularity, concerning the angle taken from one to the other of the c-axis and the m-axis.

In the III-nitride semiconductor laser device according to the present invention, preferably, the angle is in the range of not less than −5 degrees and not more than +5 degrees on a second plane perpendicular to the first plane and the normal axis.

This III-nitride semiconductor laser device has the end faces satisfying the foregoing perpendicularity, concerning the angle defined on the plane perpendicular to the normal axis to the semipolar surface.

In the III-nitride semiconductor laser device according to the present invention, the electrode extends in a direction of a predetermined axis, and the first and second fractured faces intersect with the predetermined axis.

Another aspect of the present invention relates to a method for fabricating a III-nitride semiconductor laser device. This method comprises the steps of (a) preparing a substrate comprised of a hexagonal III-nitride semiconductor and having a semipolar primary surface; (b) forming a substrate product having a laser structure, an anode electrode and a cathode electrode, the laser structure including a substrate and a semiconductor region formed on the semipolar primary surface; (c) scribing a first surface of the substrate product in part in a direction of an a-axis of the hexagonal III-nitride semiconductor; and (d) carrying out breakup of the substrate product by press against a second surface of the substrate product, to form another substrate product and a laser bar. The first surface is opposite to the second surface. The semiconductor region is located between the second surface and the substrate. The laser bar has first and second end faces, the first and second end faces extend from the first surface to the second surface, and the first and second end faces are made by the breakup. The first and second end faces forms a laser cavity of the III-nitride semiconductor laser device. The anode electrode and the cathode electrode are formed on the laser structure. The semiconductor region comprises a first cladding layer comprised of a first conductivity type GaN-based semiconductor, a second cladding layer comprised of a second conductivity type GaN-based semiconductor, and an active layer provided between the first cladding layer and the second cladding layer. The first cladding layer, the second cladding layer, and the active layer is arranged along an axis normal to the semipolar primary surface. The active layer comprises a GaN-based semiconductor layer. A c-axis of the hexagonal III-nitride semiconductor of the substrate is inclined at an angle CALPHA with respect to the normal axis toward an m-axis of the hexagonal III-nitride semiconductor. The first and second end faces intersect with an m-n plane defined by the normal axis and the m-axis of the hexagonal III-nitride semiconductor. The angle is in one of a range of not less than 45 degrees and not more than 80 degrees and a range of not less than 100 degrees and not more than 135 degrees. The laser structure comprises a laser waveguide on the semipolar primary surface of the support base, the laser waveguide extends in a direction of a waveguide vector, and the waveguide vector extends in a direction from one of to another of the first and second end faces. The first end face makes an angle $\beta$ with a reference plane perpendicular to the waveguide vector in a first plane, the first plane is perpendicular to the m-n plane, and the angle $\beta$ is defined on an end face of the support base in the first end face. The first end face makes an angle $\alpha$ with the reference plane in a second plane, the second plane is perpendicular to the m-n plane, and the angle $\alpha$ is defined on an end face of the active layer in the first end face. The angle $\alpha$ is different from the angle $\beta$, a sign of the angle $\alpha$ is the same as that of the angle $\beta$, and a difference between the angle $\alpha$ and the angle $\beta$ is not less than 0.1 degrees.

According to this method, the first surface of the substrate product is scribed in the direction of the a-axis of the hexagonal III-nitride semiconductor and thereafter the breakup of the substrate product is carried out by press against the second surface of the substrate product, thereby forming the other substrate product and the laser bar. For this reason, the first and second end faces are formed in the laser bar so as to intersect with the m-n plane, which is defined by the normal axis and the m-axis of the hexagonal III-nitride semiconductor. This method of forming an end face provides the first and second end faces for cavity mirror faces with flatness and perpendicularity enough to construct the laser cavity of the III-nitride semiconductor laser device, or without ion damage.

In this method, the laser waveguide extends in the direction of inclination of the c-axis of the hexagonal III-nitride semiconductor, and optical cavity end faces for the laser waveguide can be formed without using dry-etching.

Since the first fractured face is not any cleaved facet, the fractured face is inclined at an angle $\beta$ with respect to the above reference plane (which is perpendicular to the waveguide vector) on the end face of the support base, and is inclined at an angle $\alpha$ with respect to the reference plane on the and face of the active layer. In this fractured face is comprised of a curved surface in which a difference between the angle $\alpha$ and the angle $\beta$ is not less than 0.1 degrees. The fractured face is inclined at these angles that are defined with respect to the reference plane, and therefore can reduce the effect of the disturbance due to the return light that enters the relevant fractured face (end faces of the active layer and the substrate).

In the method according to the other aspect of the present invention, the angle $\beta$ is greater than that of the angle $\alpha$. This method can reduce the quantity of return light that enters the substrate through the end face of the substrate, and can decrease the angle $\alpha$ on the end face of the active layer. In the method according to the other aspect of the present invention, the waveguide vector makes an angle of not less than 0.1 degrees with a normal vector of an a-n plane defined by the normal axis and an a-axis of the hexagonal III-nitride semiconductor. In the III-nitride semiconductor laser device, the inclination of the laser waveguide with respect to the normal vector of the a-n plane increase the resistance to the influence of disturbance due to return light. In the III-nitride semiconductor laser device according to the other aspect of the present invention, the angle $\alpha$ is not more than 0.5 degrees. When the angle $\alpha$ is too large, the lasing characteristics is reduced.

In the method according to the present invention, in the step of forming the substrate product, processing such as slicing or grinding of the substrate is performed so that a thickness of the substrate becomes not more than 400 μm, and the first surface can be a processed surface made by the processing. Alternatively, it can be a surface including an electrode formed on the processed surface.

In the method according to the present invention, in the step of forming the substrate product, the substrate is polished so that a thickness of the substrate becomes not less than 50 μm and not more than 100 μm, and the first surface can be a polished surface formed by the polishing. Alternatively, it can be a surface including an electrode formed on the polished surface.

When the substrate has such thickness, it is feasible to form the first and second end faces with flatness and perpendicularity enough to construct the laser cavity of the III-nitride semiconductor laser device, or without ion damage, in excellent yield.

In the method according to the present invention, more preferably, the angle CALPHA can be in the range of not less than 45 degrees and not more than 80 degrees or in the range of not less than 100 degrees and not more than 134 degrees. When the angle is in the range of less than 45 degrees or in the range of more than 135 degrees, an m-plane is likely to appear in part of an end face made by press. When the angle is in the range of more than 80 degrees and less than 100 degrees, the desired flatness and perpendicularity are not achieved.

In the method according to the present invention, more preferably, the angle CALPHA can be in the range of not less than 63 degrees and not more than 80 degrees or in the range of not less than 100 degrees and not more than 117 degrees. When this angle is in the range of less than 63 degrees or in the range of more than 117 degrees, an m-plane is likely to appear in part of an end face made by press. When the angle is in the range of more than 80 degrees and less than 100 degrees, the desired flatness and perpendicularity are not achieved.

In the method according to the present invention, preferably, the semipolar primary surface is any one of a {20-21} plane, a {10-11} plane, a {20-2-1} plane, and a {10-1-1} plane.

Using these exemplary semipolar planes can provide the first and second end faces with flatness and perpendicularity enough to construct the laser cavity of the III-nitride semiconductor laser device, or without ion damage.

In the method according to the present invention, the semipolar primary surface also suitably applicable is a surface with a slight slant toward the m-plane in the range of not less than −4 degrees and not more than +4 degrees from any one semipolar plane of a {20-21} plane, a {10-11} plane, a {20-2-1} plane, and a {10-1-1} plane.

When the primary surface has the slight slant from these typical semipolar planes, it is also feasible to provide the first and second end faces with flatness and perpendicularity enough to construct the laser cavity of the III-nitride semiconductor laser device, or without ion damage.

In the method according to the present invention, the scribing is carried out using a laser scriber, the scribing forms a scribed groove, and a length of the scribed groove is shorter than a length of the line of intersection between the first surface and an a-n plane defined by the a-axis of the hexagonal III-nitride semiconductor and the normal axis.

According to this method, the other substrate product and the laser bar are formed by fracture of the substrate product. This fracture is brought about by using the scribed groove shorter than the fracture line of the laser bar.

In the method according to the present invention, an end face of the active layer in each of the first and second end faces can make an angle with respect to a reference plane perpendicular to the m-axis of the substrate of the hexagonal nitride semiconductor, and the angle is in the range of not less than (CALPHA−5) degrees and not more than (CALPHA+5) degrees on a plane defined by the c-axis and the m-axis of the hexagonal III-nitride semiconductor.

This method allows for forming the end faces with the aforementioned perpendicularity, as to the angle taken from one to the other of the c-axis and the m-axis.

In the method according to the present invention, the substrate can be comprised of any one of GaN, AlN, AlGaN, InGaN and InAlGaN.

This method allows the first and second end faces applicable to the cavity to be obtained through the use of the substrate of one of these GaN-based semiconductors.

BRIEF DESCRIPTION OF THE DRAWINGS

The above object and the other objects, features, and advantages of the present invention can more readily become clear in view of the following detailed description of the preferred embodiments of the present invention proceeding with reference to the accompanying drawings.

FIG. 3 is a drawing showing a band structure in an active layer in the III-nitride semiconductor laser device.

FIG. 8 is a drawing showing a scanning electron microscope image of a cavity end face, along with a {20-21} plane in crystal lattices.

FIG. 14 is a drawing showing angles between (20-21) plane and other plane orientations (indices).

FIG. 16 is a drawing schematically showing an apparatus for fracturing and a fractured face.

DETAILED DESCRIPTION OF THE PREFERRED EMBODIMENTS

The expertise of the present invention can be readily understood in view of the following detailed description with reference to the accompanying drawings provided by way of illustration only. The following will describe embodiments of the III-nitride semiconductor laser device and the method for fabricating the III-nitride semiconductor laser device according to the present invention, with reference to the accompanying drawings. The same portions will be denoted by the same reference symbols if possible.

Figure 1:
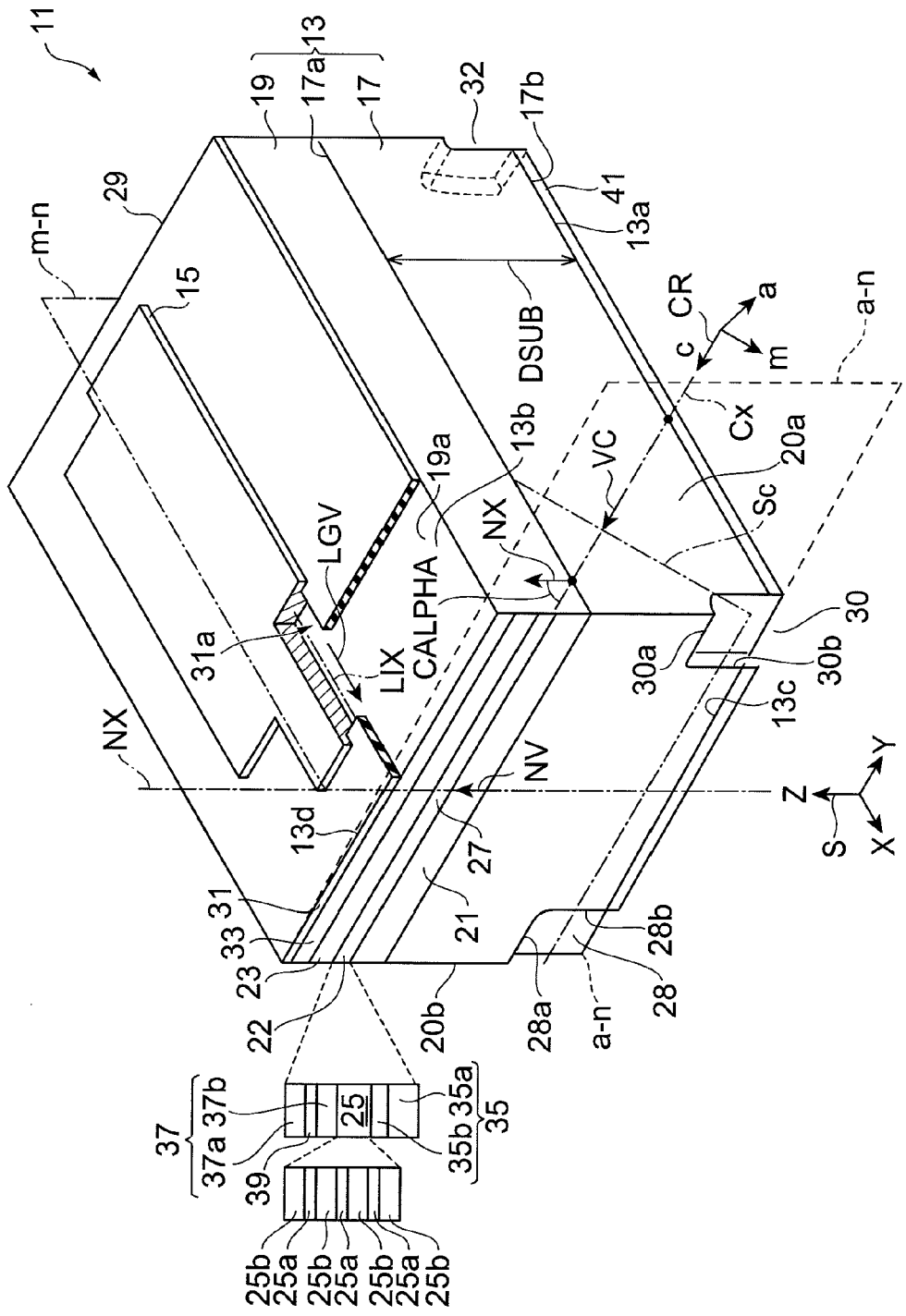
FIG. 1 is a drawing schematically showing a structure of a III-nitride semiconductor laser device according to an embodiment of the present invention.

FIG. 1 is a drawing schematically showing a structure of a III-nitride semiconductor laser device according to an embodiment of the present invention. The III-nitride semiconductor laser device 11 has a gain-guiding type structure, but embodiments of the present invention are not limited to the gain-guiding type structure. The III-nitride semiconductor laser device 11 has a laser structure 13 and an electrode 15. The laser structure 13 includes a support base 17 and a semiconductor region 19. The support base 17 comprises a hexagonal III-nitride semiconductor, and has a semipolar primary surface 17a and a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 is comprised of a first conductivity type GaN-based semiconductor, e.g., n-type AlGaN, n-type InAlGaN, or the like. The second cladding layer is comprised of a second conductivity type GaN-based semiconductor, e.g., p-type AlGaN, p-type InAlGaN, or the like. The active layer 25 is provided between the first cladding layer 21 and the second cladding layer 23. The active layer 25 includes GaN-based semiconductor layers, and the GaN-based semiconductor layers are, for example, well layers 25a. The active layer 25 includes barrier layers 25b comprised of a GaN-based semiconductor, and the well layers 25a and the barrier layers 25b are alternately arranged. The well layers 25a are comprised, for example, of InGaN or the like, and the barrier layers 25b are comprised, for example, of GaN, InGaN, or the like. The active layer 25 can include a quantum well structure provided so as to generate light at the wavelength of not less than 360 nm and not more than 600 nm. Use of a semipolar plane is suitable for generation of light at the wavelength of not less than 430 nm and not more than 550 nm. The first cladding layer 21, the second cladding layer 23, and the active layer 25 are arranged along an axis NX normal to the semipolar primary surface 17a. In the III-nitride semiconductor laser device 11, the laser structure 13 includes a first fractured face 27 and a second fractured face 29 that intersect with an m-n plane defined by the m-axis of the hexagonal III-nitride semiconductor and the normal axis NX.

Referring to FIG. 1, an orthogonal coordinate system S and a crystal coordinate system CR are depicted. The normal axis NX is directed along a direction of the Z-axis of the orthogonal coordinate system S. The semipolar primary surface 17a extends in parallel with a predetermined plane defined by the X-axis and the Y-axis of the orthogonal coordinate system S. In FIG. 1, a typical c-plane Sc is also depicted. The c-axis of the hexagonal III-nitride semiconductor of the support base 17 is inclined at a finite angle CALPHA with respect to the normal axis NX toward the m-axis of the hexagonal III-nitride semiconductor.

The III-nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 is comprised of a hexagonal III-nitride semiconductor. The insulating film 31 has an aperture 31a, and this aperture 31a extends in a direction of the line of intersection LIX between the surface 19a of the semiconductor region 19 and the foregoing m-n plane, and is, for example, a stripe shape. The electrode 15 is in contact with the surface 19a of the semiconductor region 19 (e.g., a contact layer 33 of the second conductivity type) through the aperture 31a, and extends in the direction of the foregoing line of intersection LIX. In the III-nitride semiconductor laser device 11, a laser waveguide includes the first cladding layer 21, the second cladding layer 23 and the active layer 25, and also extends in the direction of the foregoing line of intersection LIX. For example, in a gain-guide type laser, the aperture 31a of the insulating film 31 has a stripe shape, and the direction of the laser waveguide is directed to the direction in which the stripe aperture extends. In a ridge type laser, the semiconductor region 19 has a ridge structure, and the direction of the laser waveguide is directed to the direction in which the ridge structure extends. The waveguide vector LGV indicates the direction of the laser waveguide.

In the III-nitride semiconductor laser device 11, the first fractured face 27 and the second fractured face 29 intersect with the m-n plane defined by the normal axis NX and the m-axis of the hexagonal III-nitride semiconductor. The III-nitride semiconductor laser device 11 has a laser cavity, which is constituted by the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. The semiconductor region 19 is provided between the second surface 13b and the support base 17. The first and second fractured faces 27 and 29 each extend from an edge 13c of the first surface 13a to an edge 13d of the second surface 13b. The first and second fractured faces 27 and 29 are different from the conventional cleaved facets such as c-planes, m-planes, or a-planes. FIG. 1 shows a simplified version of the shape of the fractured face 27 in order to reduce its complexity in the drawing.

In this III-nitride semiconductor laser device 11, the first and second fractured faces 27 and 29 that form the laser cavity intersect with the m-n plane. This allows for provision of the laser waveguide that extends in the direction of the line of intersection between the m-n plane and the semipolar plane 17a. For this reason, the III-nitride semiconductor laser device 11 has the laser cavity enabling a low threshold current.

In the III-nitride semiconductor laser device 11, the angle CALPHA between the normal axis NX and the c-axis of the hexagonal III-nitride semiconductor is in the range of not less than 45 degrees and preferably not more than 80 degrees or the range of not less than 100 degrees and preferably not more than 135 degrees. The laser structure 13 has a laser waveguide provided on the semipolar surface 17a of the support base 17. This laser waveguide extends in the direction of the waveguide vector LGV oriented in the direction of one of the first and second fractured faces 27, 29 to the other.

Figure 2:
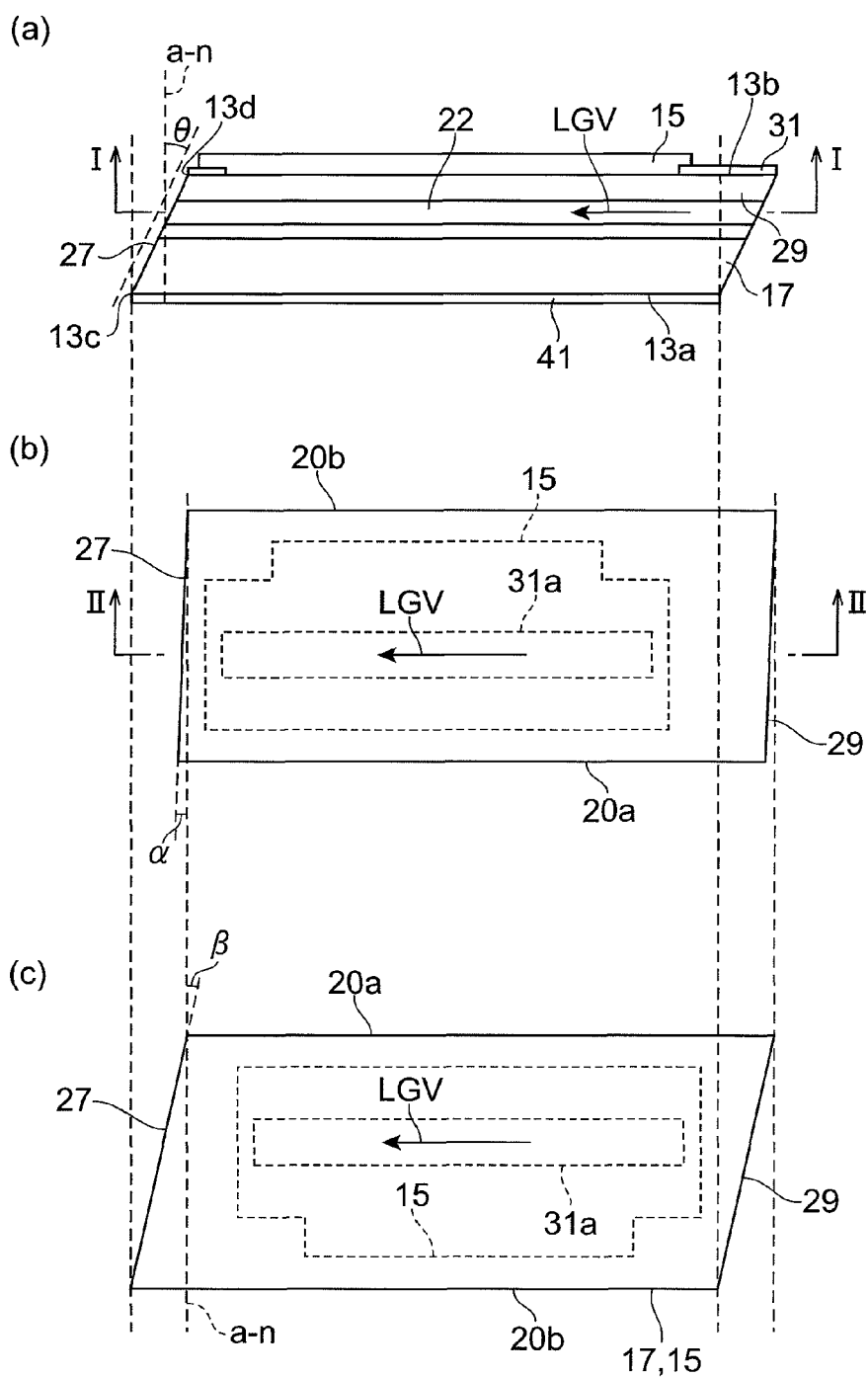
FIG. 2 is a drawing showing one example of the formation of a fractured face.

FIG. 2 shows one example of the shape of the fractured face, and in order to reduce complexity in the drawing, a piece of the scribed mark is not depicted in the figure. The fractured face is schematically shown as a straight line in the cross section in Parts (a) to (c) of FIG. 2 in order to show magnitude relation of angles α and β, but a real fractured face may be not drawn as a straight line. Part (a) of FIG. 2 is a cross sectional view showing the III-nitride semiconductor laser device 11. Part (b) of FIG. 2 is a cross sectional view showing the active layer of the III-nitride semiconductor laser device 11. Part (c) of FIG. 2 is a plan view showing the back side of the III-nitride semiconductor laser device 11. The cross section in Part (a) of FIG. 2 is taken along II-II line in Part (c) of FIG. 2. The cross section in Part (b) of FIG. 2 is taken along I-I line in Part (a) of FIG. 2. With reference to Part (a) of FIG. 2, the fractured face 27 is inclined to the a-n plane at an angle θ. With reference to Part (b) of FIG. 2, the fractured face 27 is inclined to the a-n plane at an angle α. With reference to Part (c) of FIG. 2, the fractured face 27 is inclined to the a-n plane at an angle β. The fractured face 27 is inclined as shown in FIG. 2. A sign of the angle α is the same as that of the angle β̃. Since the first fractured face 27 is not any cleaved facet, the first fractured face 27 is inclined at the angle β on the end face of the support base 17 and is inclined at the angle α on an end face of the active layer. The first fracture face 27 is inclined with respect to the a-n plane globally. The fractured face 27 is composed of a curved surface rather than a planar surface, and in the curved surface, the angle β is not less than 0.1 degrees. Since the fractured face 27 has an inclination angles α and β defined in the above reference plane, this fractured face can reduce the effect of disturbance due to return light that enters the fractured face (the end faces of the active layer and the support base). The angle α is more than zero degrees, and is not more than 0.5 degrees. The angle β is more than zero degrees, and is not more than 5 degrees.

Referring again to FIG. 1, the support base 17 of the laser structure 13 has a recess provided in one fractured face (e.g., the first fractured face 27). FIG. 1 shows the recesses 28 and 30 of an exemplary shape. The recesses 28 and 30 extend from the back surface 17b of the support base 17. The recesses 28 and 30 are provided at a portion of the edge 13c of the first surface 13a. The recesses 28 and 30 have dead ends 28a and 30a located apart from the edge 13d of the second surface 13b, respectively.

Furthermore, the recesses 28 and 30 extend along the a-n plane defined by the normal axis NX and the a-axis of the hexagonal III-nitride semiconductor. For this reason, better flatness is provided to the end face of the active layer exposed in the fractured face 27. The recesses 28 and 30 correspond to scribed grooves before fracture and, therefore, are pieces of scribed marks, respectively. The recess 28 extends from the side face 20b along the a-n plane, and is located at one edge of the side face 20b. The recess 30 extends from the side face 20a along the a-n plane, and is located at one edge of the side face 20. The pieces of scribed marks are provided from the back surface 17b of the support base 17, and the corresponding scribed grooves are provided in the back surface 17b of the support base 17. This enables the press of a blade onto the top of thin films to cause the breakup, and the top of thin films is opposite to the back side of the support base 17. The fractured face formed as above has excellent flatness and perpendicularity for use as an end face for an optical cavity.

The recesses 28 and 30 are associated with scribed grooves. In order to provide the laser structure 13 with a fracture face for an optical cavity, the scribed grooves can guide the direction that the fracture propagates. The scribed grooves are formed in the back side of the substrate (support base 17), and the press is carried out on the second surface 13b of the laser structure 13. Since the pressing force for the fracture is applied to the second surface (epi-surface) 13b in alignment with the arrangement of the scribed grooves, the edge 13d of the second surface 13b is formed near an a-n plane and the line of the arrangement of the scribed grooves, as compared with the edge 13c of the first surface 13a, and the displacement of the edge 13d from the arrangement line (the a-n plane) is made small. The edge 13c of the first surface 13a is also formed along the line of the arrangement of the scribed grooves, but the displacement of the edge 13c from the arrangement line (the a-n plane) is made large, as compared with the edge 13c of the second surface 13b. The fractured face 27 includes surface that connects with edges 13c and 13d and edges of the recesses 28 and 30. A part of the fractured face extends between the edge 13d and the edge of the recess 28. A part of the fractured face extends between the edge 13d and the edge of the recess 30.

The distance between the a-n plane and the line of intersection of the fractured face 27 and the m-n plane (the line that extends from the first point on the edge of the second surface 13b to the second point on the edge 13c of the first surface 13a and is perpendicular to the surface 17a) is increased in the direction from the edge 13d to the edge 13c. In other words, a line that connects one point on the edge 13c (for example, Y-coordinate Y1) with one point on the edge 13d (for example, Y-coordinate Y1) is inclined to the a-n plane. The distance between one point on this line and foot of a perpendicular from the one point onto the a-n plane (the length of the perpendicular line) is increased toward a negative direction of the Z axis. When three Y coordinates as above are defined on the neighborhood of the edge 28b of a portion of the scribed mark 28, the neighborhood of the edge 30b of a portion of the scribed mark 30, and the center between the edge 28b and the edge 30b, then three line segments are defined as above. These line segments are not parallel to one another, and the foregoing distances in the above three points (the length of the perpendicular lines) increase, for example, in the direction of one of the other of the side faces 20a and 20b. On the edge 13c, the foregoing distances in the above three points (the length of the perpendicular lines) having the same Z coordinate increase, for example, in the direction of one of the other of the side faces 20a and 20b. This direction of the increase indicates the direction that the fracture is developed.

The side edges 28b and 30b of the recesses 28 and 30 are located apart from the reference plane that passes through the aperture 31 of the insulating film 31 and the light emitting region of the active layer 25, and is defined in the direction of the normal axis NX.

In the present example, the support base 17 of the laser structure 13 has a recess 32 that is associated with a scribed groove provided on the other fractured face (for example, the second fracture face 29). The recess 32 extends along the side face 20a of the III-nitride semiconductor laser device 11. The recess 32 has a portion of a scribed mark as the recess 30 does. The recess 32 can also have, for example, the same shape as the recess 30. The recess 32 also extends along the a-n plane as the recess 30 does.

The scribed grooves are useful for guiding the developing direction of fracture. When the thickness of the support base 17 is smaller than the depth of the grooves, the recesses 30 and 32 reach the semiconductor region 19. The fractured face 29 also has the same or similar shape as the fractured face 27.

The III-nitride semiconductor laser device 11 includes an n-side light guide layer 35 and a p-side light guide layer 37. The n-side light guide layer 35 includes a first portion 35a and a second portion 35b, and the n-side light guide layer 35 is comprised, for example, of GaN, InGaN, or the like. The p-side light guide layer 37 includes a first portion 37a and a second portion 37b, and the p-side light guide layer 37 is comprised, for example, of GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

Figure 4:
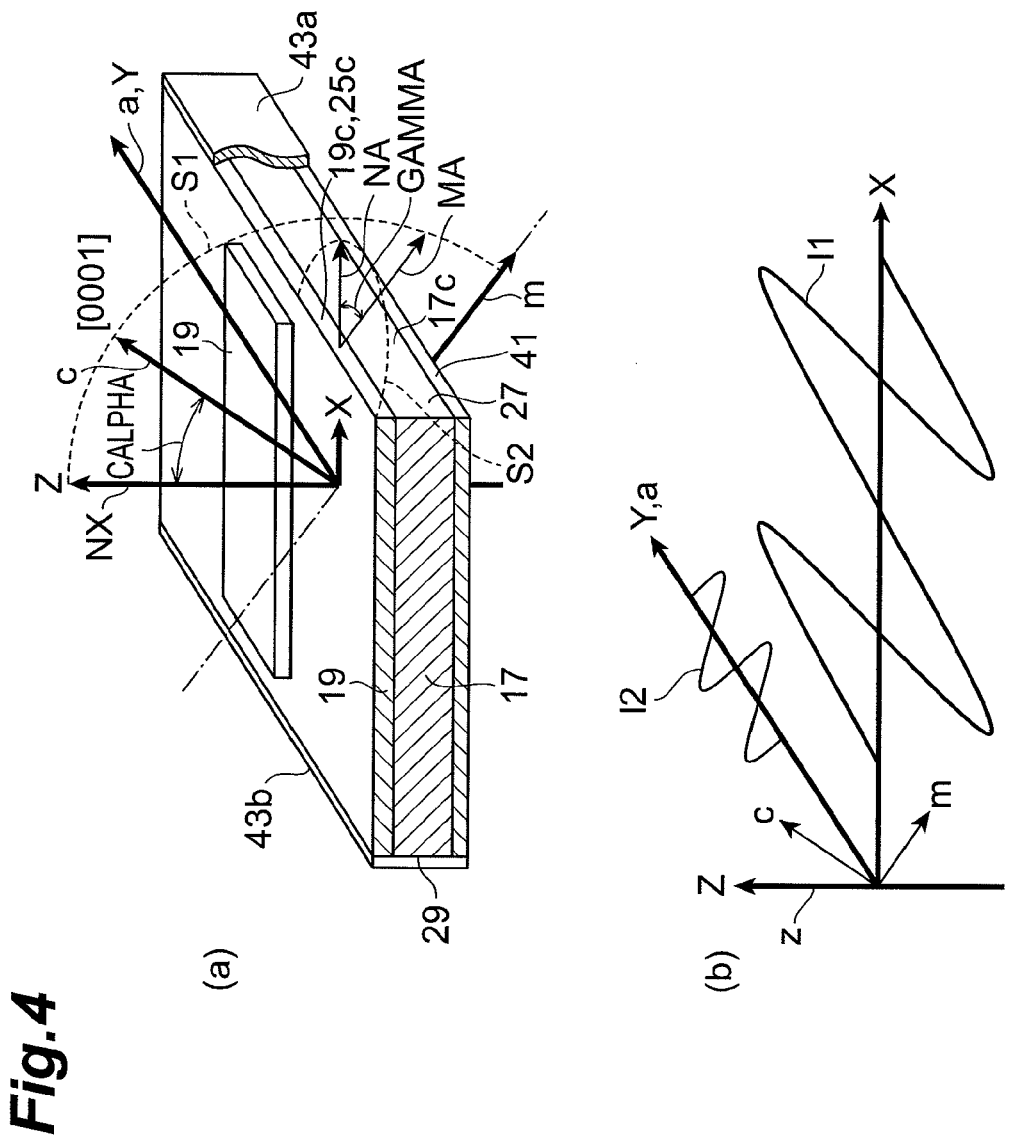
FIG. 4 is a drawing showing polarization of emission in the active layer of the III-nitride semiconductor laser device.
Figure 5:
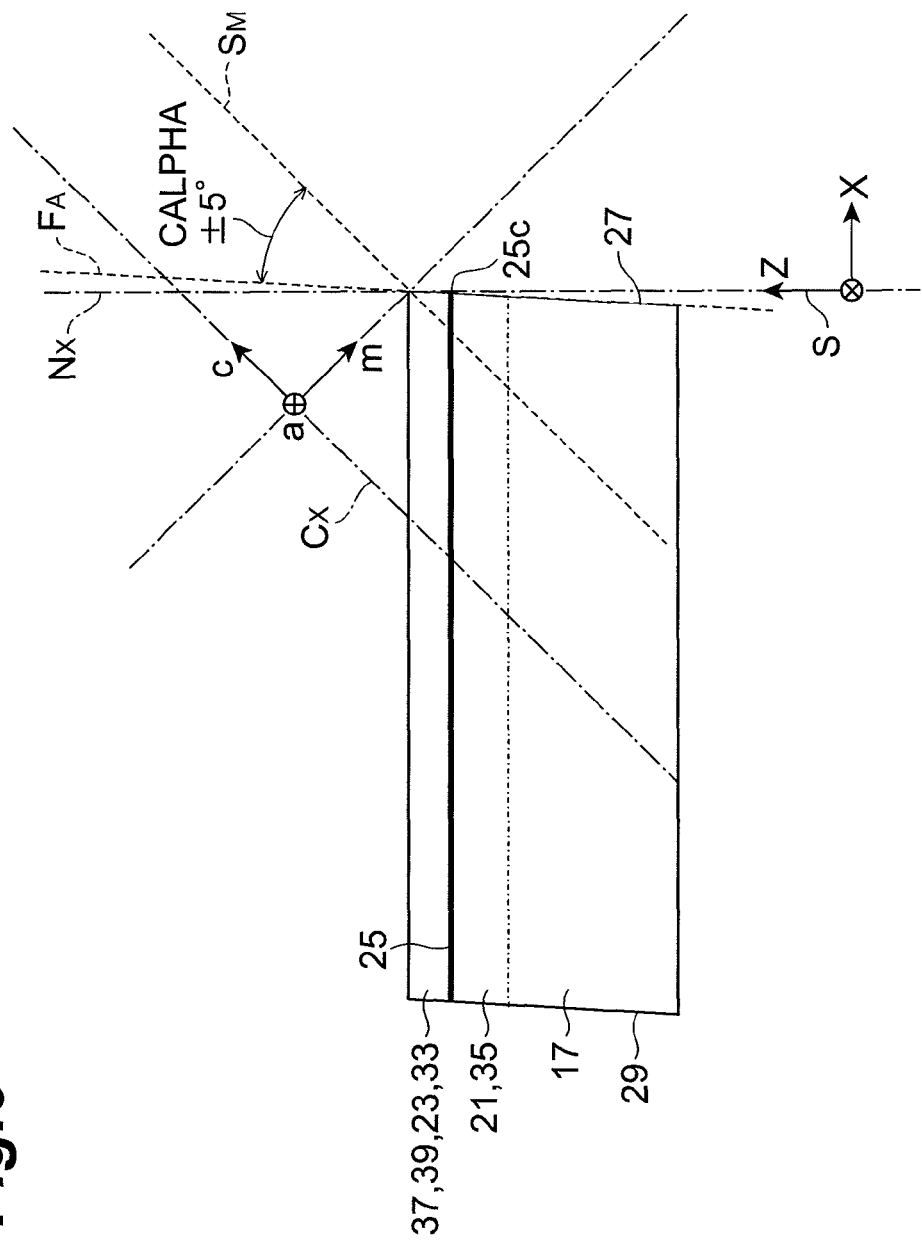
FIG. 5 is a drawing showing a relation between an end face of the III-nitride semiconductor laser device and an m-plane of the active layer.

FIG. 3 is a drawing showing a band structure in the active layer in the III-nitride semiconductor laser device. FIG. 4 is a drawing showing polarization of emission in the active layer 25 of the III-nitride semiconductor laser device 11. FIG. 5 is a drawing schematically showing a cross section defined by the c-axis and the m-axis. With reference to part (a) of FIG. 3, three possible transitions are shown between the conduction band and valence bands in the vicinity of Γ point of the band structure BAND. The energy difference between band A and band B is relatively small. An emission by transition Ea between the conduction band and band A is polarized in the a-axis direction and an emission by transition Eb between the conduction band and band B is polarized in the direction of the c-axis projected onto the primary surface. Concerning lasing, a threshold of transition Ea is smaller than a threshold of transition Eb.

With reference to part (b) of FIG. 3, there are shown spectra of light in the LED mode in the III-nitride semiconductor laser device 11. The light in the LED mode has a polarization component I1 in the direction of the a-axis of the hexagonal III-nitride semiconductor, and a polarization component I2 in the projected direction of the c-axis of the hexagonal III-nitride semiconductor onto the primary surface, and the polarization component I1 is larger than the polarization component I2. Degree of polarization ρ is defined by (I1−I2)/(I1+I2). By using the laser cavity of the III-nitride semiconductor laser device 11, the device can emit laser light in a mode with large emission intensity in the LED mode.

As shown in FIG. 4, the device may be further provided with dielectric multilayer film 43a, 43b on at least one of the first and second fractured faces 27 and 29 or with both on the respective faces. An end face coat is also applicable to the fractured faces 27 and 29. The end face coat allows adjustment of reflectance.

As shown in part (b) of FIG. 4, the laser light L from the active layer 25 is polarized in the direction of the a-axis of the hexagonal III-nitride semiconductor. In this III-nitride semiconductor laser device 11, a band transition allowing for implementation of a low threshold current has polarized nature. The first and second fractured faces 27, 29 for the laser cavity are different from the conventional cleaved facets such as c-planes, m-planes, or a-planes. However, the first and second fractured faces 27 and 29 have flatness and perpendicularity enough as mirrors for the cavity. For this reason, by using the first and second fractured faces 27 and 29 and the laser waveguide extending between these fractured faces 27 and 29, as shown in part (b) of FIG. 4, it becomes feasible to achieve low-threshold lasing through the use of the emission by transition Ea stronger than the emission by transition Eb polarized in the direction by indicating projection of the c-axis onto the primary surface.

In the III-nitride semiconductor laser device 11, an end face 17c of the support base 17 and an end face 19c of the semiconductor region 19 are exposed in each of the first and second fractured faces 27 and 29, and the end face 17c and the end face 19c are covered by the dielectric multilayer film 43a. An angle GAMMA between a normal vector NA to the end face 17c of the support base 17 and an end face 25c in the active layer 25, and an m-axis vector MA of the active layer 25 is defined by component $(GAMMA)_1$ and component $(GAMMA)_2$, and the component $(GAMMA)_1$ is defined on a first plane S1 defined by the c-axis and m-axis of the III-nitride semiconductor, and the component $(GAMMA)_2$ is defined on a second plane S2 perpendicular to the first plane S1 and the normal axis NX. The component $(GAMMA)_1$ is preferably in the range of not less than (CALPHA−5) degrees and not more than (CALPHA+5) degrees on the first plane S1 defined by the c-axis and m-axis of the III-nitride semiconductor. This angle range is shown as an angle between a typical m-plane $S_M$ and a reference plane $F_A$ in FIG. 5. The typical m-plane $S_M$ is depicted from the inside to the outside of the laser structure in FIG. 5, for easier understanding. The reference plane $F_A$ extends along the end face 25c of the active layer 25. This III-nitride semiconductor laser device 11 has the end faces in which the aforementioned perpendicularity is satisfied as to the angle GAMMA taken from one to the other of the c-axis and the m-axis. The component $(GAMMA)_2$ is preferably in the range of not less than −5 degrees and not more than +5 degrees on the second plane S2. Here, $GAMMA^2 = (GAMMA)_1^2 + (GAMMA)_2^2$. In this case, the end faces 27 and 29 of the III-nitride semiconductor laser device 11 satisfy the aforementioned perpendicularity as to the angle defined on the plane perpendicular to the axis NX normal to the semipolar plane 17a.

Referring again to FIG. 1, in the III-nitride semiconductor laser device 11, the thickness DSUB of the support base 17 is preferably not more than 400 µm. This III-nitride semiconductor laser device is suitable for obtaining good-quality fractured faces for the laser cavity. In the III-nitride semiconductor laser device 11, the thickness DSUB of the support base 17 is more preferably not less than 50 µm and not more than 100 µm. This III-nitride semiconductor laser device 11 is more suitable for obtaining good-quality fractured faces for the laser cavity. Furthermore, handling becomes easier and the production yield becomes higher.

In the III-nitride semiconductor laser device 11, the angle CALPHA between the normal axis NX and the c-axis of the hexagonal III-nitride semiconductor is preferably not less than 45 degrees and preferably not more than 80 degrees. Furthermore, the angle CALPHA is preferably not less than 100 degrees and preferably not more than 135 degrees. When the angle is in the range of less than 45 degrees or in the range of more than 135 degrees, the end faces made by press are highly likely to be comprised of m-planes. When the angle is in the range of more than 80 degrees and less than 100 degrees, it could result in failing to achieve the desired flatness and perpendicularity.

In the III-nitride semiconductor laser device 11, more preferably, the angle CALPHA between the normal axis NX and the c-axis of the hexagonal III-nitride semiconductor is not less than 63 degrees and not more than 80 degrees. Furthermore, the angle CALPHA is more preferably not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, it could result in failing to achieve the desired flatness and perpendicularity.

The semipolar primary surface 17a can be any one of a {20-21} plane, a {10-11} plane, a {20-2-1} plane, and a {10-1-1} plane. Furthermore, a surface with a slight slant in the range of not less than −4 degrees and not more than +4 degrees with respect to these planes is also suitable for the primary surface. On the semipolar surface 17a of one of these typical planes, it is feasible to provide the first and second end faces 27 and 29 with flatness and perpendicularity enough to construct the laser cavity of the III-nitride semiconductor laser device 11. Furthermore, the end faces with sufficient flatness and perpendicularity are obtained in an angular range across these typical plane orientations.

In the III-nitride semiconductor laser device 11, the stacking fault density of the support base 17 can be not more than $1 \times 10^4$ cm$^{-1}$. Since the stacking fault density is not more than $1 \times 10^4$ cm$^{-1}$, the flatness and/or perpendicularity of the fractured faces is less likely to be disturbed for a certain accidental reason. The support base 17 can be comprised of any one of GaN, AlN, AlGaN, InGaN and InAlGaN. When the substrate comprised of any one of these GaN-based semiconductors is used, the end faces 27 and 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease the lattice mismatch rate between the substrate and the light emitting layer and to improve crystal quality.

Figure 6:
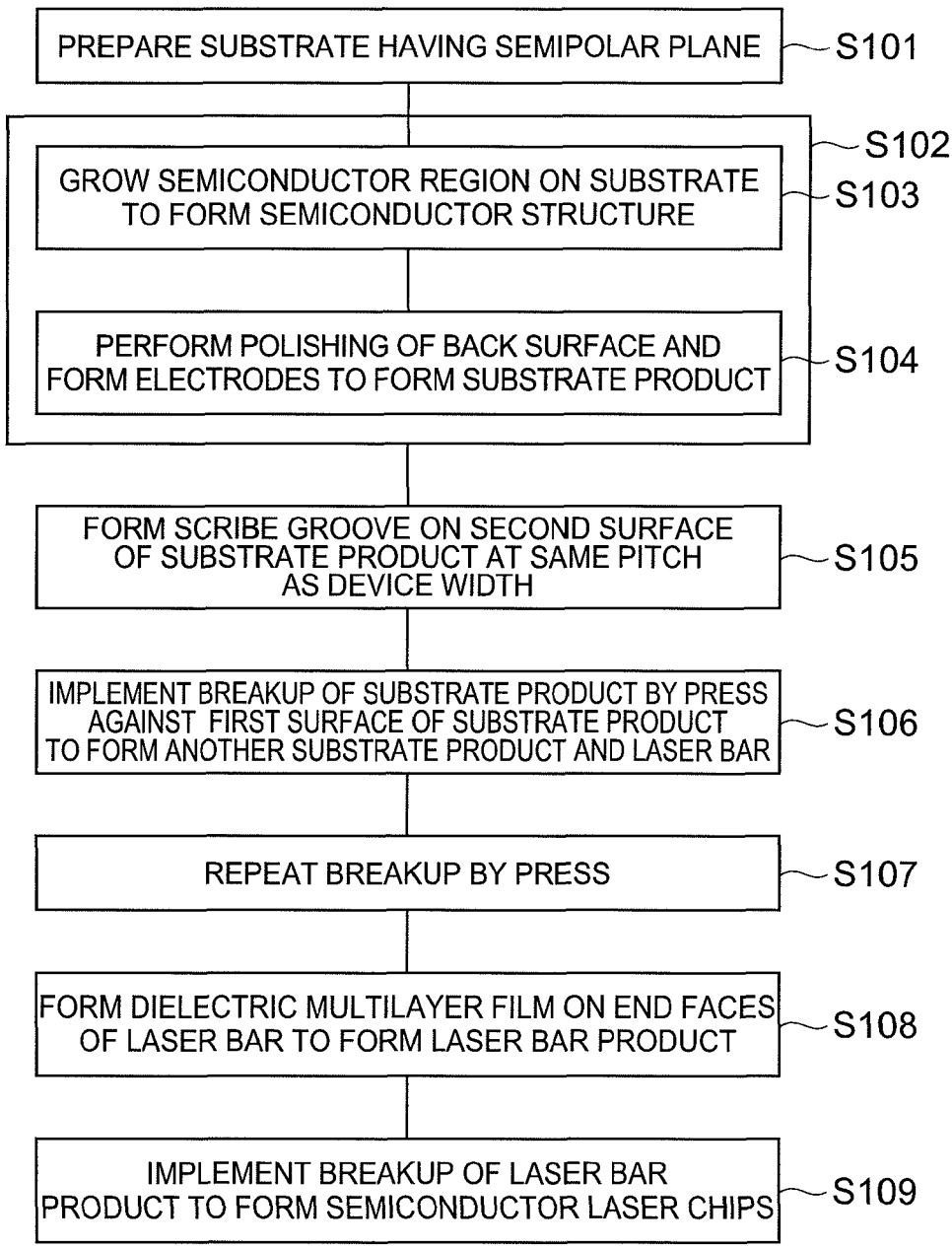
FIG. 6 is a flowchart showing major steps in a method for fabricating a III-nitride semiconductor laser device according to an embodiment of the present invention.

FIG. 6 is a drawing showing major steps in a method of fabricating a III-nitride semiconductor laser device according to an embodiment of the present invention. With reference to part (a) of FIG. 7, a substrate 51 is shown. In Step S101, the substrate 51 is prepared for fabrication of the III-nitride semiconductor laser device. The c-axis (vector VC) of the hexagonal III-nitride semiconductor of the substrate 51 is inclined at the angle ALPHA with respect to the normal axis NX toward the m-axis (vector VM) of the hexagonal III-nitride semiconductor. For this reason, the substrate 51 has a semipolar primary surface 51a comprised of the hexagonal III-nitride semiconductor.

In Step S102, a substrate product SP is formed. In part (a) of FIG. 7, the substrate product SP is depicted as a member of a nearly disk-like shape, but the shape of the substrate product SP is not limited to this. For obtaining the substrate product SP, in step S103, first, the formation of a laser structure 55 is formed. The laser structure 55 includes a semiconductor region 53 and the substrate 51, and in step S103, the semiconductor region 53 is formed on the semipolar primary surface 51a. For forming the semiconductor region 53, a first conductivity type GaN-based semiconductor region 57, a light emitting layer 59, and a second conductivity type GaN-based semiconductor region 61 are grown in order on the semipolar primary surface 51a. The GaN-based semiconductor region 57 can include, for example, an n-type cladding layer, and the GaN-based semiconductor region 61 can include, for example, a p-type cladding layer. The light emitting layer 59 is provided between the GaN-based semiconductor region 57 and the GaN-based semiconductor region 61, and can include an active layer, light guide layers, an electron block layer, and so on. The GaN-based semiconductor region 57, the light emitting layer 59, and the second conductivity type GaN-based semiconductor region 61 are arranged along the normal axis NX to the semipolar primary surface 51a. These semiconductor layers are epitaxially grown thereon. The surface of the semiconductor region 53 is covered by an insulating film 54. The insulating film 54 is comprised, for example, of silicon oxide. The insulating film 54 has an aperture 54a. The aperture 54a is, for example, a stripe shape.

In Step S104, an anode electrode 58a and a cathode electrode 58b are formed on the laser structure 55. Before forming the electrode on the back surface of the substrate 51, the back surface of the substrate used in crystal growth is polished to form a substrate product SP in a desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. These steps result in forming the substrate product SP. The substrate product SP includes a first surface 63a, and a second surface 63b located opposite thereto. The semiconductor region 53 is located between the second surface 63a and the substrate 51.

Figure 7:
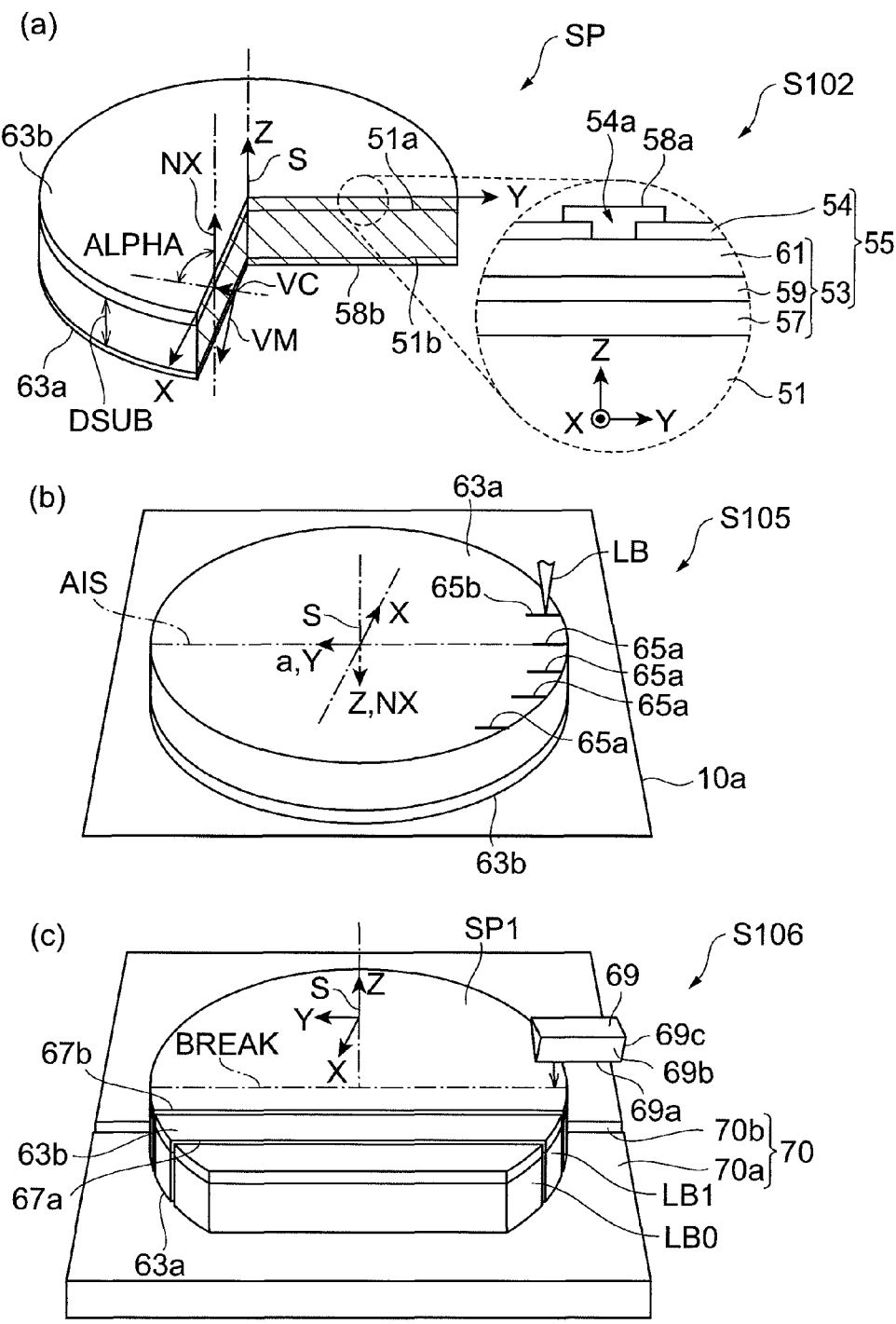
FIG. 7 is a drawing schematically showing major steps in the method for fabricating the III-nitride semiconductor laser device according to the embodiment.

In Step S105, as shown in part (b) of FIG. 7, the first surface 63a of the substrate product SP is scribed. This scribing step is carried out with a laser scriber 10a. This scribing can provide scribed grooves 65a. In part (b) of FIG. 7, five scribed grooves are already formed and formation of a scribed groove 65b is in progress with a laser beam LB. The length of the scribed grooves 65a is shorter than the length of a line of intersection AIS defined by the normal axis NX and the a-n plane that is defined by the first surface 63a and the a-axis of the hexagonal III-nitride semiconductor, and the laser beam LB is applied to a part of the intersection line AIS. By the application with the laser beam LB, grooves extending in the specific direction and reaching the semiconductor region are formed in the first surface 63a. The scribed grooves 65a can be formed, for example, at an edge of the substrate product SP. It is also possible to form plural scribed grooves arrayed along the intersecting line MS. For forming each individual scribed groove, the laser beam LB is incident nearly perpendicular to the first surface 63a.

The scribed groove 65a is useful for guiding the developing direction of fracture. The scribed groove 65a has the depth (value in the Z-axis direction), width (value in the X-axis direction), and length (value in the Y-axis direction), and extends along the a-n plane as to the depth and length directions thereof. For providing the laser structure 55 with the fractured faces for the cavity, the scribed groove 65a is useful for guiding the propagating direction of fracture and is formed in the back surface 51a of the substrate (support base 17) 51, and the press is implemented on the second surface 63b of the laser structure 55. The fracture develops in the direction from the first surface 63a to the second surface 63b with the scribed groove 65a as an origin, and also develops in a direction intersecting with it.

In Step S106, as shown in part (c) of FIG. 7, breakup of the substrate product SP is implemented by press against the second surface 63b of the substrate product SP to form a substrate product SP1 and a laser bar LB1. The press is carried out with a breaking tool, for example, like a blade 69. The blade 69 includes an edge 69a extending in one direction, and at least two blade faces 69b and 69c that defines the edge 69a. The press onto the substrate product SP1 is carried out on a support apparatus 70. The support apparatus 70 includes a support table 70a and a recess 70b, and the recess 70b extends in one direction. The recess 70b is located in the support table 70a. The orientation and position of the scribed groove 65a of the substrate product SP1 are aligned with the extending direction of the recess 70b of the support device 70 to position the substrate product SP1 to the recess 70b on the support device 70. The orientation of the edge of the breaking device is aligned with the extending direction of the recess 70b, and the edge of the breaking device is pressed against the substrate product SP1 from a direction intersecting with the second surface 63b. The intersecting direction is preferably an approximately normal direction to the second surface 63b. This implements the breakup of the substrate product SP to form the substrate product SP1 and laser bar LB1. The press results in forming the laser bar LB1 with first and second end faces 67a and 67b, and these end faces 67a, 67b have perpendicularity and flatness enough to make at least a part of the light emitting layer applicable to the cavity mirrors of the semiconductor laser.

The array of scribed grooves are formed in the back surface 51b of the substrate 51 so as to guide the developing direction of fracture, and the press is implemented on the second surface 63b of the laser structure 55. The fracture originates from each scribed groove that works as an origin and propagates in the direction from the first surface 63a to the second surface 63b (e.g., the Z-axis direction), and also propagates in a direction intersecting with it (e.g., the Y-axis direction).

When the scribed grooves and their array are formed in the back surface of the substrate and extend along the plane defined by the a-axis and the normal axis, and the substrate product is broken up by the press applied to the top of thin films with the blade, it is feasible to produce the mirrors for the optical cavity with excellent flatness and perpendicularity and to increase the resistance to return light in semiconductor lasers formed on the semipolar plane.

In the step of scribing the substrate product SP1, a number of scribed grooves can be formed at the pitch equal to the device width of the III-nitride semiconductor laser device. Since the scribed grooves are formed at the pitch of the device width, the guidance of fracture is implemented for each device width in development of fracture in the Y-axis direction. For this reason, we can expect secure guidance in the generating direction of fracture. The scribed grooves that are arrayed at the pitch equal to the device width can guide the developing direction of fracture. The arrayed grooves ensure good quality for the end faces of laser stripes located between the scribed grooves.

The laser bar LB1 thus formed has the first and second end faces 67a and 67b made by the aforementioned breakup, and each of the end faces 67a and 67b extends from the first surface 63a to the second surface 63b. For this reason, the end faces 67a and 67b form the laser cavity of the III-nitride semiconductor laser device, and intersect with an XZ plane. This XZ plane corresponds to the m-n plane defined by the normal axis NX and the m-axis of the hexagonal III-nitride semiconductor.

According to this method, the first surface 63a of the substrate product SP is scribed in the direction of the a-axis of the hexagonal III-nitride semiconductor, and thereafter the breakup of the substrate product SP is carried out by press against the second surface 63b of the substrate product SP, thereby forming the new substrate product SP1 and the laser bar LB1. For this reason, the first and second end faces 67a and 67b are formed in the laser bar LB I so as to intersect with the m-n plane. This end face forming method provides the first and second end faces 67a and 67b with flatness and perpendicularity enough to construct the laser cavity of the III-nitride semiconductor laser device.

In this method, the laser waveguide formed as above extends in the direction of inclination of the c-axis of the hexagonal III-nitride. The mirror end faces for optical cavity allowing for provision of this laser waveguide are formed without use of dry-etched faces.

This method involves the fracture of the substrate product SP1, thereby forming the new substrate product SP1 and the laser bar LB1. In Step S107, the breakup by press is repeatedly carried out to produce a number of laser bars. This fracture is brought about using the scribed grooves 65a shorter than a fracture line BREAK of the laser bar LB1.

In Step S108, dielectric multilayer films are formed on the end faces 67a and 67b of the laser bar LB1 to form a laser bar product. In Step S109, this laser bar product is broken into chips of individual semiconductor lasers. Each semiconductor laser chip has a pair of side faces for the semiconductor laser.

In the fabrication method according to the present embodiment, the angle CALPHA can be in the range of not less than 45 degrees and not more than 80 degrees or in the range of not less than 100 degrees and not more than 135 degrees. When the angle is in the range of less than 45 degrees or in the range of more than 135 degrees, the end face made by press becomes highly likely to be comprised of an m-plane. When the angle is in the range of more than 80 degrees and less than 100 degrees, it could result in failing to achieve the desired flatness and perpendicularity. More preferably, the angle CALPHA can be in the range of not less than 63 degrees and not more than 80 degrees or in the range of not less than 100 degrees and not more than 117 degrees. When the angle is in the range of less than 63 degrees or in the range of more than 117 degrees, an m-plane can appear in part of an end face formed by press. When the angle is in the range of more than 80 degrees and less than 100 degrees, it could result in failing to achieve the desired flatness and perpendicularity. The semipolar primary surface 51a can be any one of a {20-21} plane, a {10-11} plane, a {20-2-1} plane, and a {10-1-1} plane. Furthermore, a surface with a slight slant in the range of not less than −4 degrees and not more than +4 degrees from each plane as above is also suitable for the primary surface. On these typical semipolar planes, it is feasible to provide the end faces for the laser cavity with flatness and perpendicularity enough to construct the laser cavity of the III-nitride semiconductor laser device.

The substrate 51 can be comprised of any one of GaN, AlN, AlGaN, InGaN, and InAlGaN. When the substrate used is comprised of any one of these GaN-based semiconductors, it is feasible to obtain the end faces applicable to the laser cavity. The substrate 51 is preferably comprised of GaN.

In the step S104 of forming the substrate product SP, the semiconductor substrate used in crystal growth can be subjected to processing such as slicing or grinding so that the substrate thickness becomes not more than 400 μm, and has the first surface 63b of a processed surface formed by polishing. In this substrate thickness, the end faces 67a and 67b can be formed in good yield with flatness and perpendicularity enough to construct the laser cavity of the III-nitride semiconductor laser device and without ion damage. More preferably, the first surface 63b is a polished surface formed by polishing and the thickness of the polished substrate is not more than 100 μm. In order to ensure easily handling of the substrate product SP, the substrate thickness is preferably not less than 50 μm.

In the production method of the laser end faces according to the present embodiment, the angle GAMMA explained with reference to FIG. 4 is also defined in the laser bar LB1. In the laser bar LB1, the component (GAMMA)$_1$ of the angle GAMMA is preferably in the range of not less than (CALPHA−5) degrees and not more than (CALPHA+5) degrees on the first plane (which corresponds to the first plane S1 in the description with reference to FIG. 4) defined by the c-axis and m-axis of the III-nitride semiconductor. The end faces 67a and 67b of the laser bar LB1 satisfy the aforementioned perpendicularity as to the angle component of the angle GAMMA taken from one to the other of the c-axis and the m-axis. The component (GAMMA)$_2$ of the angle GAMMA is preferably in the range of not less than −5 degrees and not more than +5 degrees on the second plane (which corresponds to the second plane S2 shown in FIG. 4). In this case, the end faces 67a and 67b of the laser bar LB1 satisfy the aforementioned perpendicularity as to the angle component of the angle GAMMA defined on the plane perpendicular to the normal axis NX to the semipolar plane 51a.

The end faces 67a and 67b are formed by breakup in application of pressing force against plural GaN-based semiconductor layers epitaxially grown on the semipolar surface 51a. Since the laminate made of epitaxial films on the semipolar plane 51a, the end faces 67a and 67b are not cleaved facets with a low plane index like c-planes, m-planes, or a-planes, which have been used heretofore for the conventional mirrors for optical cavity. However, through the break of the stack of epitaxial films on the semipolar surface 51a, the end faces 67a and 67b have the flatness and perpendicularity applicable as mirrors for optical cavity.

Example 1

A semipolar-plane GaN substrate is prepared and perpendicularity of a fractured face is observed as described below. A {20-21}-plane GaN substrate is used as the substrate, which is cut at the angle of 75 degrees toward the m-axis out of a (0001) GaN ingot thickly grown by HVPE. The primary surface of the GaN substrate is mirror-finished, and the back surface is in a ground pear-skin state. The thickness of the substrate is 370 µm.

On the back side in the pear-skin state, a marking line is drawn perpendicularly to the direction of the projected c-axis onto the primary surface of the substrate with a diamond pen, and thereafter the substrate is fractured by press. For observing the perpendicularity of the resultant fractured face, the substrate is observed from the a-plane direction with a scanning electron microscope.

Part (a) of FIG. 8 shows a scanning electron microscope image of the fractured face observed from the a-plane direction, and the right end face is the fractured face. It is seen that the fractured face has flatness and perpendicularity to the semipolar primary surface.

Example 2

Figure 9:
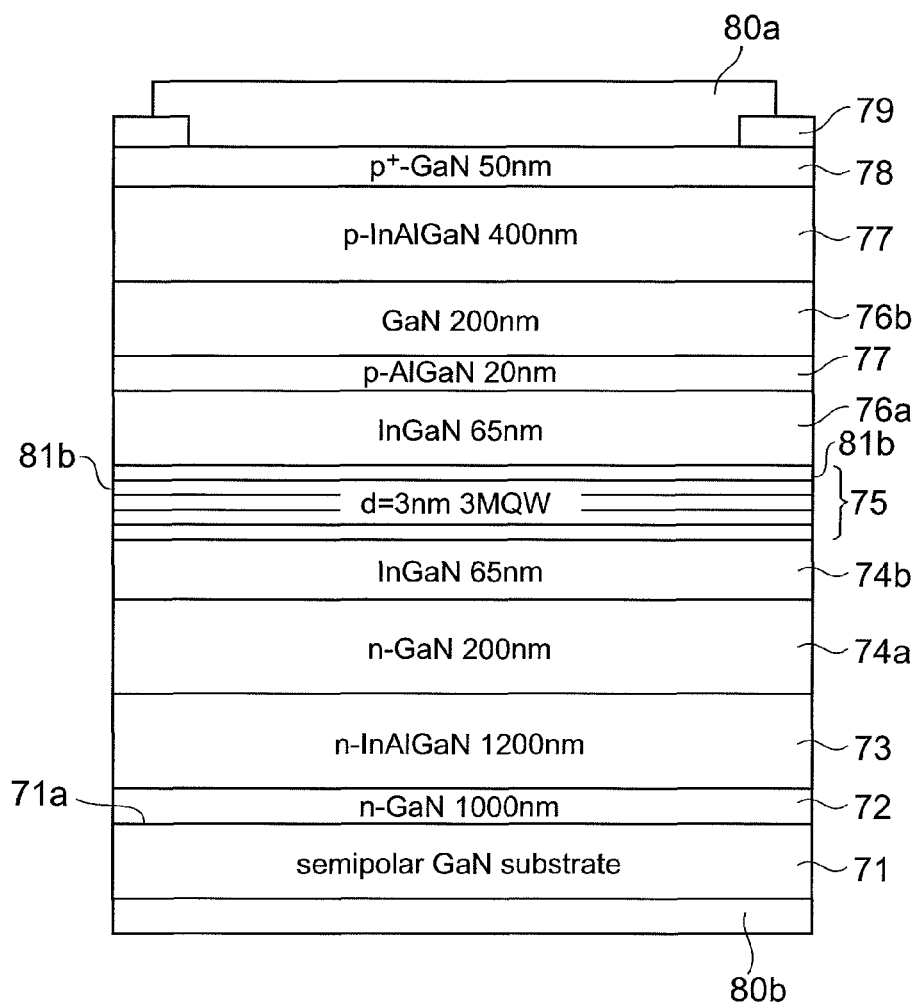
FIG. 9 is a drawing showing a structure of a laser diode shown in Example 1.

Example 1 shows that, in the GaN substrate having the semipolar {20-21} plane, the fractured face is obtained by drawing the marking line perpendicular to the direction of the c-axis projected onto the primary surface of the substrate and pressing the substrate, and has the flatness and perpendicularity to the primary surface of the substrate. For checking applicability of this fractured face to the laser cavity, a laser diode shown in FIG. 9 is grown by metal-organic vapor phase epitaxy as described below. The raw materials used are trimethyl gallium (TMGa), trimethyl aluminum (TMAl), trimethyl indium (TMIn), ammonia ($NH_3$), and silane ($SiH_4$). A substrate 71 is prepared. The substrate 71 prepared is a GaN substrate formed by cutting at an angle in the range of zero degrees to 90 degrees toward the m-axis out of a (0001) GaN ingot, thickly grown by HYPE, with a wafer slicing apparatus in such a manner that the angle CALPHA of inclination of the c-axis toward the m-axis has a desired off angle in the range of zero degrees to 90 degrees. For example, the substrate is cut at the angle of 75 degrees to provide the resultant substrate of a GaN {20-21}-plane, and it is referred to as reference symbol 71a in the hexagonal crystal lattice shown in part (a) of FIG. 8.

Before the growth, the substrate is observed by the cathodoluminescence method in order to estimate the stacking fault density of the substrate. The cathodoluminescence is used to observe an emission process of carriers excited by an electron beam and if a stacking fault is contained therein, non-radiative recombination of carriers occurs in the vicinity thereof to create a dark line in the observation. The stacking fault density is defined as a density (line density) per unit length of dark lines. The cathodoluminescence method of nondestructive measurement is applied herein in order to estimate the stacking fault density, but it is also possible to use a transmission electron microscope of destructive measurement. When a cross section of a sample prepared is observed from the a-axis direction with the transmission electron microscope, a defect extending in the m-axis direction from the substrate toward the sample surface corresponds to a stacking fault included in the support base, and the line density of stacking faults can be determined in the same manner as in the case of the cathodoluminescence method.

This substrate 71 is placed on a susceptor in a reactor and the epitaxial layers are grown according to the following growth procedure to form a semiconductor region on the n-type GaN substrate 71. First, an n-type GaN layer 72 is grown in the thickness of 1000 nm. Next, an n-type InAlGaN cladding layer 73 is grown in the thickness of 1200 nm. Thereafter, an n-type GaN guide layer 74a and an undoped InGaN guide layer 74b are grown in the thickness of 200 nm and in the thickness of 65 nm, respectively, and then a three-cycle MQW 75 consisting of GaN 15 nm thick/InGaN 3 nm thick is grown. Subsequently grown are an undoped InGaN guide layer 76a in the thickness of 65 nm, a p-type AlGaN block layer 77 in the thickness of 20 nm, and a p-type GaN guide layer 76b in the thickness of 200 nm. Then, a p-type InAlGaN cladding layer 77 is grown in the thickness of 400 nm. Finally, a p-type GaN contact layer 78 is grown in the thickness of 50 nm.

An insulating film 79 of $SiO_2$ is deposited on the contact layer 78, and then photolithography is used to form a stripe window in the width of 10 µm by wet etching. In this step, two types of contact windows are formed in two stripe directions respectively. They are the laser stripes extending in the following directions: (1) M-direction (direction of the contact window extending along the predetermined plane defined by the c-axis and the m-axis), and (2) A-direction: <11-20> direction.

After the formation of the stripe window, a p-side electrode 80a of Ni/Au and a pad electrode of Ti/Al are made by vapor deposition. Next, the back surface of the GaN substrate (GaN wafer) is polished using a diamond slurry to produce a substrate product with the back surface mirror-polished. At this time, the thickness of the substrate product is measured with a contact film thickness meter. The measurement of thickness may also be carried out from a sample cross section with a microscope. The microscope applicable herein is an optical microscope or a scanning electron microscope. An n-side electrode 80b of Ti/Al/Ti/Au is formed by vapor deposition on the back surface (polished surface) of the GaN substrate (GaN wafer).

The cavity mirrors for these two types of laser stripes are produced with a laser scriber using the YAG laser at the wavelength of 355 nm. When the break is implemented with the laser scriber, the lasing chip yield can be improved as compared with the scribing using the diamond scribing method. The conditions for formation of the scribed grooves are as follows: laser beam output of 100 mW; scanning speed of 5 mm/s. The scribed grooves thus formed are, for example, grooves having the length of 30 µm, the width of 10 µm, and the depth of 40 µm. The scribed grooves are formed by applying the laser beam directly to the epitaxially grown surface at the pitch of 800 µm and through the aperture of the insulating film of the substrate. The cavity length is 600 µm.

The mirrors for an optical cavity are made by fracture using a blade. A laser bar is produced by break by press against the back side of the substrate. More specifically, parts (b) and (c) of FIG. 8 show relations between crystal orientations and fractured faces, for the {20-21}-plane GaN substrate. Part (b) of FIG. 8 shows the case where the laser stripe is provided (1) in the M-direction, and shows end faces 81a and 81b for the laser cavity along with the semipolar plane 71a. The end faces 81a and 81b are approximately perpendicular to the semipolar plane 71a, but are different from the conventional cleaved facets such as the hitherto-used c-planes, m-planes, or a-planes. Part (c) of FIG. 8 shows the laser stripe that is provided (2) in the <11-20> direction and shows end faces 81c and 81d for the laser resonator along with the semipolar plane 71a. The end faces 81c and 81d are approximately perpendicular to the semipolar plane 71a and are composed of a-planes.

The fractured faces made by the break are observed with a scanning electron microscope and no prominent unevenness is observed in each of (1) and (2). From this result, the flatness (magnitude of unevenness) of the fractured faces is estimated to be not more than 20 nm. Furthermore, the perpendicularity of the fractured faces to the surface of the sample is within the range of ±5 degrees.

The end faces of the laser bar are coated with a dielectric multilayer film by vacuum vapor deposition. The dielectric multilayer film is composed of an alternate stack of $SiO_2$ and $TiO_2$. The thickness of each layer is adjusted in the range of 50 to 100 nm and is designed so that the center wavelength of reflectance fell within the range of 500 to 530 nm. The reflecting surface on one end faces has ten cycles and the designed value of reflectance of about 95%, and the reflecting surface on the other end face has six cycles and the designed value of reflectance of about 80%.

Evaluation by energization is carried out at room temperature. A power supply used works as a pulsed power source with the pulse width of 500 ns and the duty ratio of 0.1%, and the energization is implemented with needles on the surface electrodes. On the occasion of light output measurement, the emission from the laser bar end face is detected with a photodiode to measure the current-light output characteristic (I-L characteristic). In measurement of emission wavelength, the emission from the laser bar end face is made to pass through an optical fiber, and a spectrum thereof is measured with a spectrum analyzer as a detector. When evaluating a polarization state, the emission from the laser bar is made to pass through a polarizing plate to rotate, thereby checking the polarization state. In observation of LED-mode emission, an optical fiber is positioned to the front surface side of the laser bar to measure light emitted from the front surface.

The polarization state in the lasing is measured for every laser, and it is found that the light is polarized in the a-axis direction. The lasing wavelength is in the range of 500-530 nm.

Figure 10:
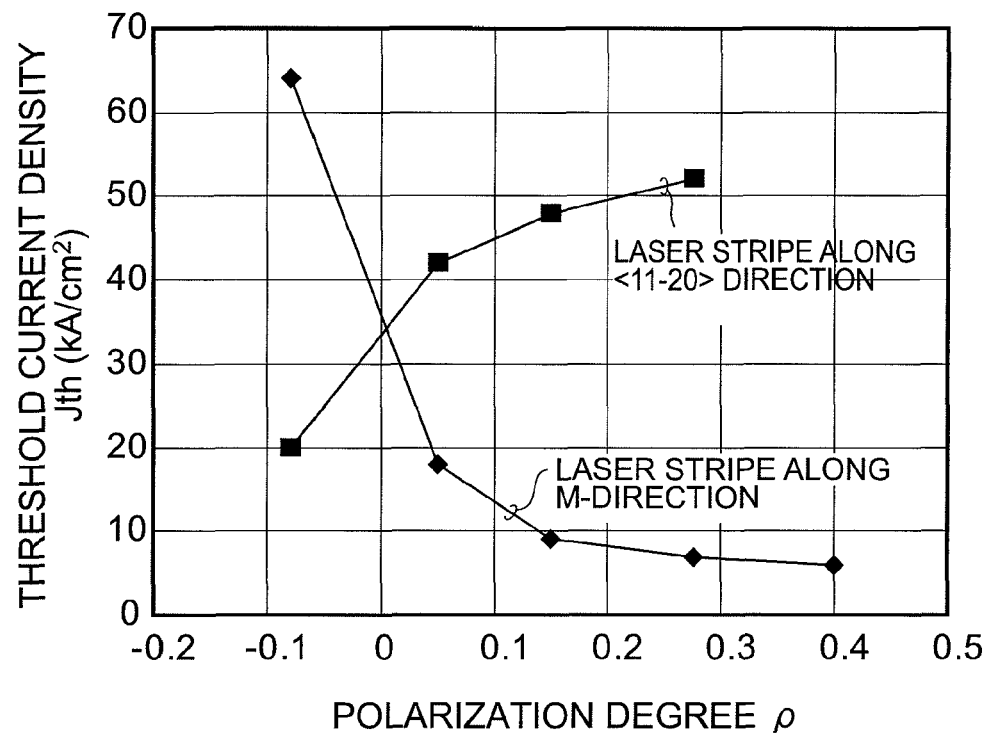
FIG. 10 is a drawing showing a relation of determined polarization degree p versus threshold current density.

The polarization state in the LED mode (spontaneous emission) is measured for every laser. When the polarization component in the a-axis direction is represented as I1 and the polarization component in the projected direction of the m-axis on the primary surface is represented by I2, the polarization degree p is defined as (I1−I2)/(I1+I2). In this way, the relation between determined polarization degree ρ and minimum of threshold current density is investigated, and the result obtained is as shown in FIG. 10. It is seen from FIG. 10 that the threshold current density demonstrates a significant decrease in the case of the laser (1) with the laser stripe along the M-direction when the polarization degree is positive. Namely, it is seen that when the polarization degree is positive (I1>I2) and when the waveguide is provided along an off-axis direction, the threshold current density is significantly decreased.

The data shown in FIG. 10 is as described below.

| Polarization degree, | Threshold current (M-direction stripe), | Threshold current (<11-20> stripe) |
|---|---|---|
| 0.08, | 64, | 20. |
| 0.05, | 18, | 42. |
| 0.15, | 9, | 48. |
| 0.276, | 7, | 52. |
| 0.4, | 6. | |

Figure 11:
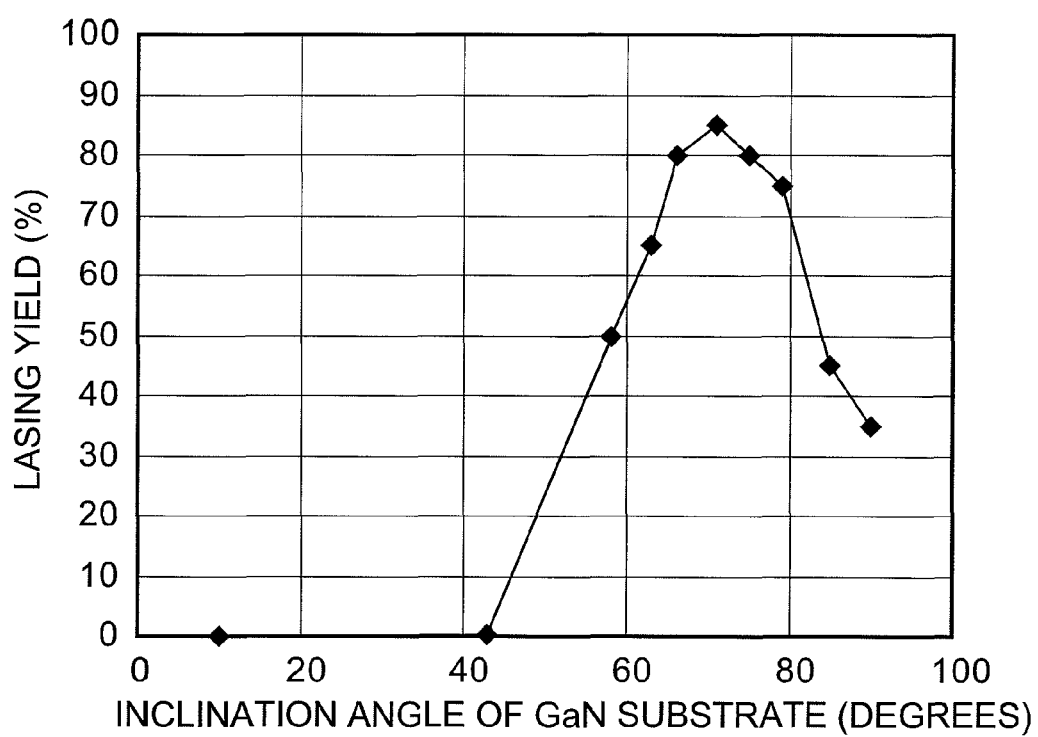
FIG. 11 is a drawing showing a relation of inclination angles of the c-axis toward the m-axis of GaN substrate versus lasing yield.

The relation between lasing yield and the inclination angle of the c-axis of the GaN substrate toward the m-axis is investigated and the result obtained is as shown in FIG. 16. In the present example, the lasing yield is defined as (the number of lasing chips)/(the number of measured chips). FIG. 11 is a plot for substrates with the stacking fault density of substrate of not more than $1\times10^4$ $(cm^{-1})$ and lasers with the laser stripe along (1) the M-direction. It is seen from FIG. 11 that the lasing yield is extremely low with the off angles of not more than 45 degrees. The end face state is observed with an optical microscope, and it is found that an m-plane appeared in almost all chips, at angles smaller than 45 degrees, resulting in failure in achieving perpendicularity. It is also seen that when the off angle is in the range of not less than 63 degrees and not more than 80 degrees, the perpendicularity is improved and the lasing yield increases to 50% or more. From these facts, the optimum range of off angle of the GaN substrate is not less than 63 degrees and not more than 80 degrees. The same result is also obtained in the range of not less than 100 degrees and not more than 117 degrees, which is an angular range to provide crystallographically equivalent end faces. The data shown in FIG. 11 is as described below.

| Inclination angle, | Yield. |
|---|---|
| 10, | 0.1. |
| 43, | 0.2. |
| 58, | 50. |
| 63, | 65. |
| 66, | 80. |
| 71, | 85. |
| 75, | 80. |
| 79, | 75. |
| 85, | 45. |
| 90, | 35. |

Figure 12:
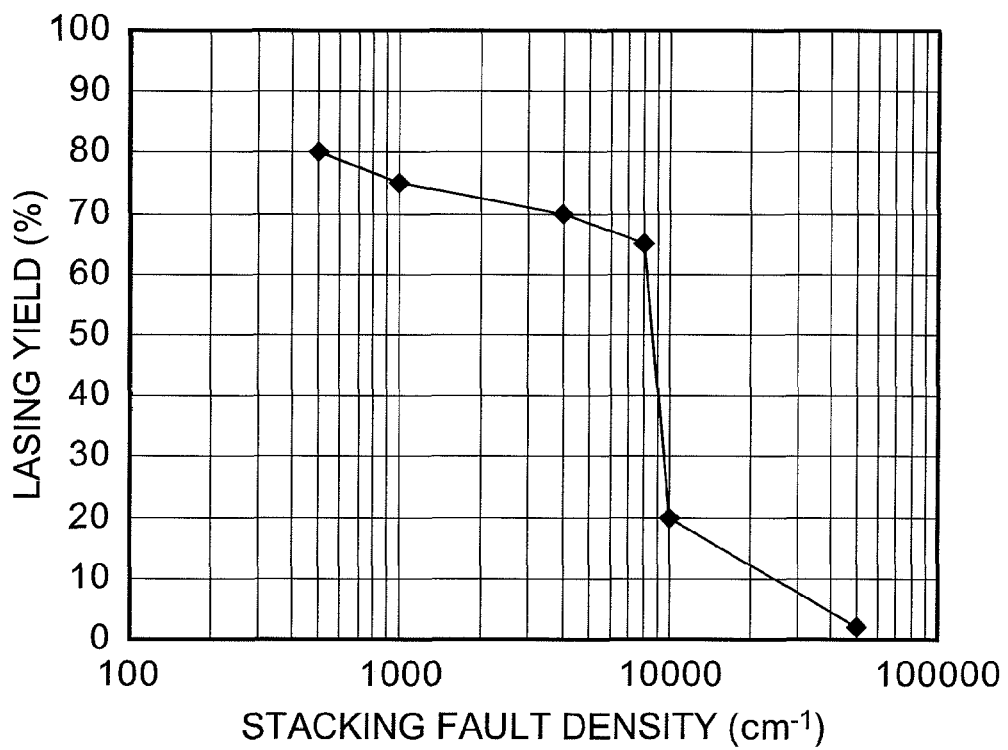
FIG. 12 is a drawing showing a relation of stacking fault density versus lasing yield.

The relation between stacking fault density and lasing yield is investigated, and the result obtained is as shown in FIG. 12. The definition of lasing yield is the same as above. It is seen from FIG. 12 that the lasing yield is suddenly decreased with the stacking fault density over $1\times10^4$ $(cm^{-1})$. When the end face state is observed with an optical microscope, it is found that with samples having the decreased lasing yield, the unevenness of the end faces is significant and no flat fractured faces are obtained. A conceivable reason is that there is a difference in easiness of fracture because of the existence of stacking faults. From this result, the stacking fault density in the substrate needs to be not more than $1\times10^4$ $(cm^{-1})$.

The data shown in FIG. 12 is as described below.

| Stacking fault density $(cm^{-1})$, | Yield. |
|---|---|
| 500, | 80. |
| 1000, | 75. |
| 4000, | 70. |
| 8000, | 65. |
| 10000, | 20. |
| 50000, | 2. |

Figure 13:
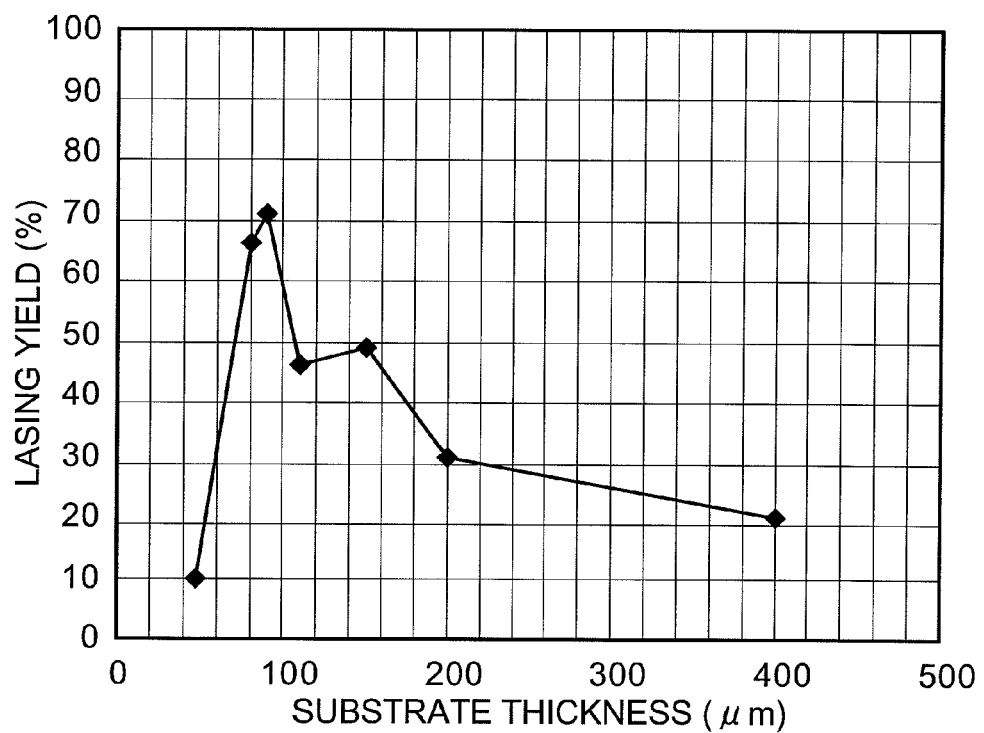
FIG. 13 is a drawing showing a relation of substrate thickness versus lasing yield.

The relation between substrate thickness and lasing yield is investigated, and the result obtained is as shown in FIG. 13. The definition of lasing yield is the same as above. FIG. 13 is a plot for lasers in which the stacking fault density of the substrate is not more than $1\times10^4$ $(cm^{-1})$ and in which the laser stripe extends along (1) the M-direction. From FIG. 13, the lasing yield is high when the substrate thickness is not more than 100 μm and not less than 50 μm. This is because the perpendicularity of fractured faces becomes deteriorated when the substrate thickness is larger than 100 μm. It is also because handling becomes difficult and a chip becomes easy to break when the thickness is smaller than 50 μm. From these, the optimum thickness of the substrate is not less than 50 μm and not more than 100 μm. The data shown in FIG. 13 is as described below.

| Substrate thickness, | Yield. |
|---|---|
| 48, | 10. |
| 80, | 65. |
| 90, | 70. |
| 110, | 45. |
| 150, | 48. |
| 200, | 30. |
| 400, | 20. |

Example 3

In Example 2, the plural epitaxial films for the semiconductor laser are grown on the GaN substrate having the {20-21} plane. The end faces for the optical cavity are formed by the formation of scribed grooves and the press as described above. In order to find candidates for these end faces, plane orientations which make an angle near 90 degrees with the (20-21) plane and are different from the a-plane are obtained by calculation. With reference to FIG. 14, the following angles and plane orientations have angles near 90 degrees to the (20-21) plane.

| Specific plane index, | Angle to {20-21} plane. |
|---|---|
| (−1016): | 92.46 degrees; |
| (−1017): | 90.10 degrees; |
| (−1018): | 88.29 degrees. |

Example 4

The above description shows that, on the GaN substrate having a semipolar (20-21) plane, flatness and perpendicularity to the substrate surface is provided to the fractured faces that are formed by pressing after carrying out scribing perpendicular to the direction of the projected c-axis onto the substrate primary surface. In order to investigate the applicability of the thus-formed fractured surface, a laser diode is grown by metal-organic vapor phase epitaxy as described below. The raw materials used herein are trimethyl gallium (TMGa), trimethyl aluminum (TMAl), trimethyl indium (TMIn), ammonia ($NH_3$), and silane ($SiH_4$). The substrate used herein is a 2-inch {20-21}-plane GaN substrate grown by HVPE.

Figure 15:
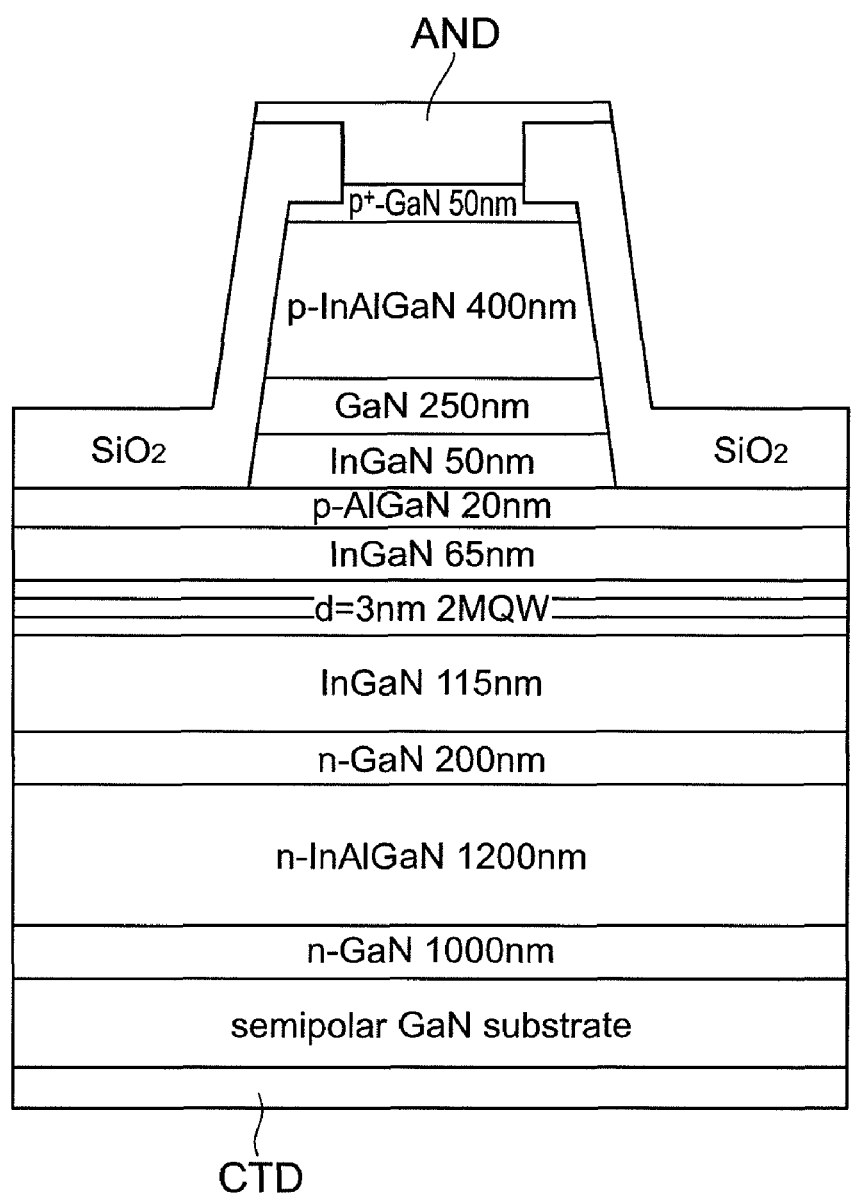
FIG. 15 is a drawing schematically showing the structure of an index guide type laser with a ridge structure.

This GaN substrate is placed on a susceptor in a reactor and thereafter epitaxial layers for an epitaxial substrate, as shown in FIG. 15, are grown on the GaN substrate in accordance with the following growth procedure. First, an n-type GaN layer is grown in the thickness of 1000 nm. Next, an n-type InAlGaN cladding layer is grown in the thickness of 1200 nm. Thereafter, an n-type GaN guide layer and an n-type InGaN guide layer are grown in the thickness of 200 nm and in the thickness of 115 nm, respectively. Grown thereafter is a quantum well structure, which has a two-cycle MQW of GaN (10 nm thick)/InGaN (3 nm thick). Subsequently grown are an undoped InGaN guide layer in the thickness of 65 nm, a p-type AlGaN block layer in the thickness of 20 nm, a p-type InGaN guide layer in the thickness of 50 nm, and a p-type GaN guide layer in the thickness of 200 nm. Next, a p-type InAlGaN cladding layer is grown in the thickness of 400 nm. Finally, a p-type GaN contact layer is grown in the thickness of 50 nm.

For producing the ridge structure in the width of 2 μm, a mask with a pattern in the width of 2 μm of a positive-type resist is formed by photolithography. The laser waveguide is directed in a direction parallel to the direction of the projected component defined as a projection of the c-axis vector onto the primary surface. The ridge structure is produced by dry etching using $Cl_2$. The etching depth is, for example, 0.7 μm, and etching of the semiconductor region of the epitaxial substrate is carried out until the AlGaN block layer is exposed. After the etching, the resist mask is removed. A stripe mask in the width of about 2 μm is left on the ridge structure by photolithography. The direction of the stripe mask is aligned with the direction of the ridge structure. After this, $SiO_2$ is deposited on the side faces of the ridge by vacuum vapor deposition. After the vapor deposition of the insulating film, $SiO_2$ on the ridge is removed by the lift-off method to form the insulating film with a striped aperture. Then an anode electrode and a cathode electrode are formed to obtain a substrate product.

After the formation of the stripe window, a p-side electrode AND of Ni/Au and a pad electrode of Ti/Al are made by vapor deposition. Next, the back surface of the GaN substrate (GaN wafer) is polished using a diamond slurry to produce a substrate product with the mirror-polished back surface An n-side electrode CTD of Ti/Al/Ti/Au is formed by vapor deposition on the back surface (polished surface) of the GaN substrate (GaN wafer).

The cavity mirrors for these laser stripes are made with a laser scriber using the YAG laser at the wavelength of 355 nm. The lasing chip yield can be higher in the case where the scribed grooves are formed with the laser scriber, followed by break, as compared to the case using the diamond scribing. The scribed grooves are formed under the following formation conditions.

Laser beam power output, 100 mW.
Scan speed, 5 mm/s.

The scribed grooves formed under the above conditions have, for example, the length of 30 μm, the width of 10 μm, and the depth of 40 μm. The scribed grooves are periodically formed by direct irradiation with the laser beam through openings of the electrode on the surface of the substrate at intervals of 300 μm, which correspond to the semiconductor chip width. The cavity length is 600 μm.

As shown in part (a) of FIG. 16, the cavity mirrors are made by fracture using a blade. In part (a) of FIG. 16, the dash line LN1 indicates a plane, such as {10-1-6} plane, which is inclined at a few degrees to the {10-1-7} plane that is perpendicular to the {20-21} plane, and the dash line LN2 indicates the arrangement of scribed grooves. The dash line LN2 extends in the direction of, for example, the a-axis, and the scribed grooves extend along the a-n plane defined by the a-axis and the normal axis of the primary surface of the substrate. A laser bar is formed by pressing the back side of the substrate at its edge to cause the breakup. Part (b) of FIG. 16 shows a schematic view of the fracture face. A fractured face CVT is formed by a method in which an end face is formed as a mirror and is perpendicular to the laser waveguide provided in parallel to the direction of the c-axis projected onto the primary surface. The fractured face CVT is different from the conventional cleaved facets such as m-planes, a-planes, or c-planes which are used as the end faces in lasers on such as the conventional c-planes or m-planes. In the fractured face CVT, one half of the scribed groove (a portion of a scribed mark 64a) is left. The fractured face originates at an end of the scribed groove 65a and is separated from the dash line LN2 as the fracture propagates, and the adjacent scribed groove returns the fracture to the dash line LN2, and accordingly the shape of the fractured face is made convex. Since a pressing force is applied to the epi-surface of the substrate product, curvature of the convexly-curved lower edge of the substrate is larger than that of the convexly-curved upper edge of the semiconductor region.

The end faces of the laser bar are coated with a dielectric multilayer film by vacuum vapor deposition. The dielectric multilayer film is composed of an alternate stack of $SiO_2$ and $TiO_2$. The thickness of each layer is adjusted in the range of 50 to 100 nm and is designed so that the center wavelength of reflectance fell within the range of 500 to 530 nm. The reflecting surface on one side has ten cycles and the designed value of reflectance of about 95%, and the reflecting surface on the other side has six cycles and the designed value of reflectance of about 80%.

Evaluation by energization is carried out at room temperature. A power supply used works as a pulsed power source with the pulse width of 500 ns and the duty ratio of 0.1%, and the energization is implemented with needles on the surface electrodes. On the occasion of light output measurement, the emission from the laser bar end face is detected with a photodiode to check the current-light output characteristic (I-L characteristic). In measurement of emission wavelength, the emission from the laser bar end face is made to pass through an optical fiber and a spectrum thereof is measured with a spectrum analyzer as a detector. The lasing wavelength is in the range of 500 nm to 530 nm.

Influence of return light in the nitride semiconductor laser is investigated. After evaluating electrical characteristics of the semiconductor laser, an off angle of the end face of the laser bar is estimated using a scanning electron microscope. Here, an angle $\alpha$ is defined as an angle between the waveguide vector and the normal vector of the end face of the active layer, and an angle $\beta$ is defined as an angle between the waveguide vector and the normal vector of the end face of the substrate. The correlation between relative intensity noise (RIN) and these angles are investigated, and the investigation shows that, when the angle $\alpha$ is different from the angle $\beta$, the relative intensity noise is reduced. When the difference between the angle $\alpha$ and the angle $\beta$ is not less than 0.1 degrees, the relative intensity noise characteristics become excellent. Further, when the angle $\beta$ is larger than the angle $\alpha$ ($\beta>\alpha$), the relative intensity noise is excellent. An optical component of the return light enters a semiconductor region of the laser chip between the active layer and the backside of the substrate through the end face, and is scattered in its light incidence in the direction that is not parallel to the direction of the waveguide, thereby reducing the effect of the disturbance of the return light. More preferably, the angle $\alpha$ is set at the end face of the active layer nearly perpendicular thereto, and the angle $\beta$ which is larger than the angle $\alpha$ is set at the end face of the substrate, thereby providing an improved relative intensity noise characteristics.

Figure 17:
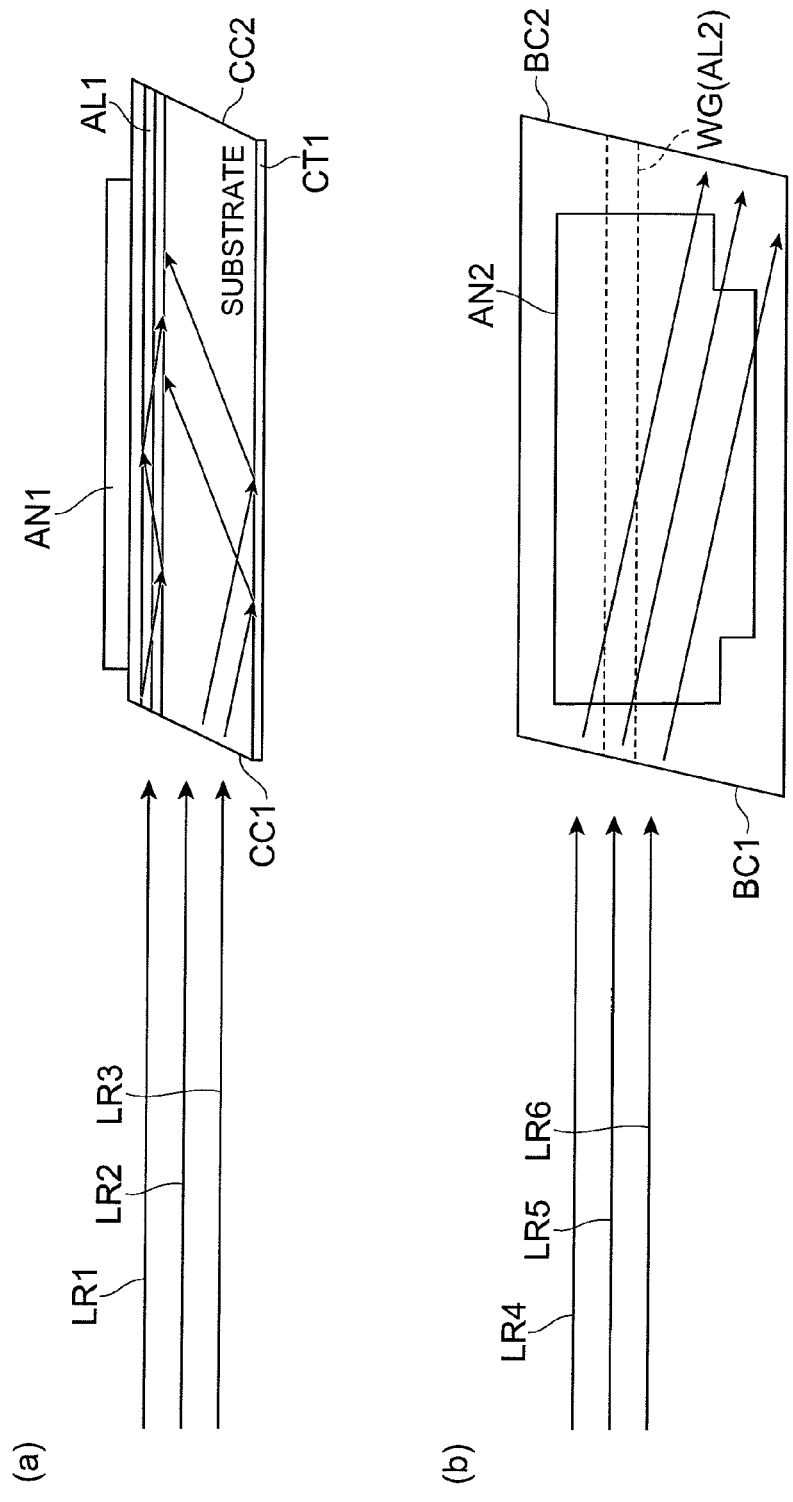
FIG. 17 is a drawing schematically showing influences of return light that depend on the inclination of the end face in the III-nitride semiconductor laser device.

With reference to FIG. 17, influence of the return light is explained below. Part (a) of the FIG. 17 shows a semiconductor laser having an end face inclined to the same direction as that of Patent Literature 6. An anode electrode AN1 is formed on the epi-surface of the laser structure, and the cathode CT1 is formed on the back side of the substrate in the laser structure. The active layer AL1 extends from the end face CC1 to the end face CC2. Three components of the return light, LR1, LR2 and LR3 are shown therein, and are incident on three points different from each other. The component LR1 is incident on and near the end face of the active layer. The component LR1 directly enters the active layer, and the component in the active layer propagates the waveguide through total internal reflection by use of the optical confinement layers between which the active layer is provided. In order to avoid this propagation, the angle $\theta$ should be not less than 10 degrees. But, the optical cavity having an end face of the angle $\theta$ of not less than 10 degrees results in a large amount of increase in the threshold current. The components LR2 and LR3 are incident on the part of the end face apart from the end face of the active layer, and are reflected by the backside of the substrate, and the reflected components return to the active layer.

Part (b) of the FIG. 17 shows a semiconductor laser having an end face inclined to the same direction as that of the present embodiment. An anode electrode AN2 is formed on the epi-surface of the laser structure, and the cathode CT2 is formed on the back side of the substrate in the laser structure. The active layer AL2 extends from the end face BC1 to the end face BC2. Three components of the return light, LR4, LR5 and LR6 are shown therein, and are incident on three points different from each other in the device width direction at the same height as the active layer AL2. The component LR5 is incident on and near the end face of the active layer. The component LR5 directly enters the active layer, but this component in the active layer is not confined in the horizontal direction and accordingly propagates in the direction different from the extending direction of the waveguide WG. The small off angles $\alpha$ and $\beta$ can provide high resistance to return light. The components LR4 and LR6 are incident on the part of the end face apart from the end face of the active layer, and propagate in the direction different from the extending direction of the waveguide WG in the laser as the component LR5 does.

Explanation is made below on the influence of return light in the nitride semiconductor laser having a fractured face inclined at the angles ($\theta$, $\alpha(\alpha<\beta)$, $\beta(\beta1, \beta2)$) in the embodiments. Referring to part (a) of FIG. 18, an anode electrode AN3 is formed on the epi-surface of the laser structure, and the cathode CT3 is formed on the back side of the substrate in the laser structure. The active layer AL2 extends from the end face BC1 to the end face BC2. The return components LR1 to LR3 are incident on the end face as in parts (a) and (b) of FIG. 17. Since the position of the active layer is near the epi-surface to which the pressing force is applied, the angle $\alpha$ is made small. Accordingly, increase in threshold current because of the return light LR1 is small. Influence of the return light is near-total absence, and the return light LR1 is incident on the semiconductor region near the surface. Referring to parts (b), (c) and (d) of FIG. 18, the off angle ($\beta1<\beta2$) is relatively large at positions on which the return components LR2 and LR3 are incident, and the propagating direction of these return components is different form the extending direction of the waveguide, thereby disenabling the propagation of the return components that are incident on the device. These components do not have any influence on increase in the threshold current. Almost all light that reaches side faces of the semiconductor laser is not reflected thereat, and attenuates with scattering. In the nitride semiconductor laser, the foregoing angles gradually increase in this direction ($\alpha<\beta1<\beta2$) on the line extending in the direction of the epi-surface to the backside of the substrate on the end face at which the waveguide appears.

Example 5

Figure 19:
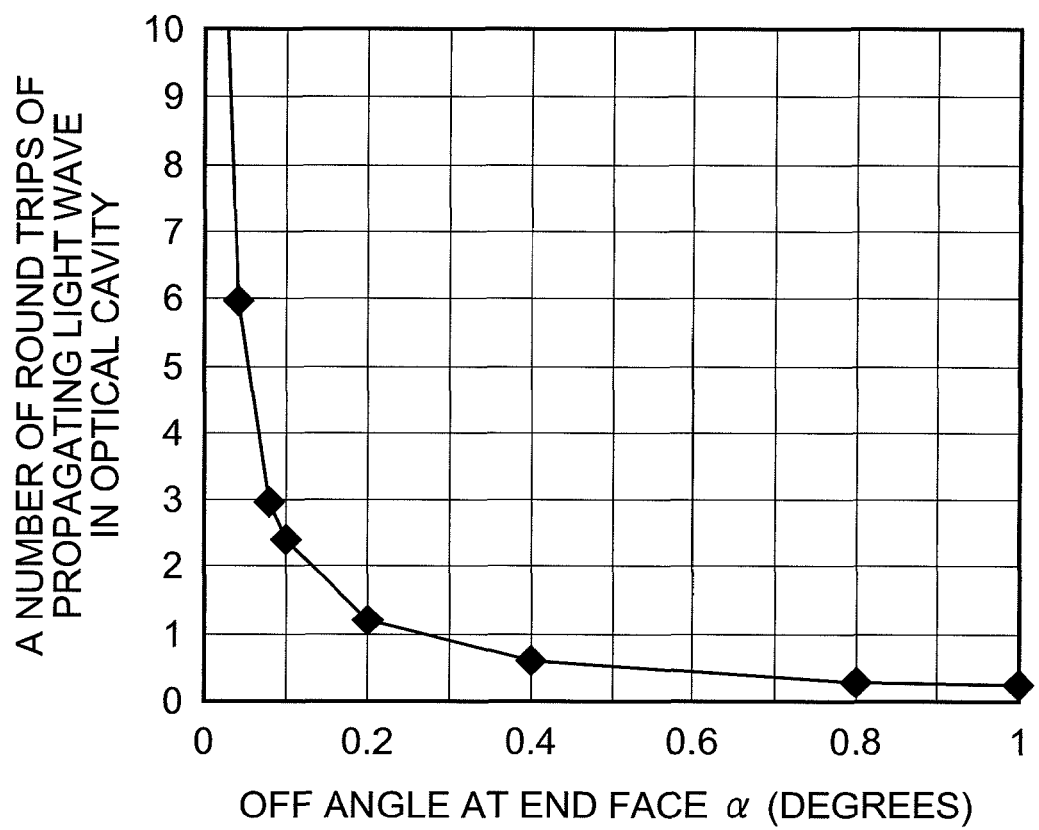
FIG. 19 is a drawing schematically showing the relation between the number of round trips of the return light and the off angle α on the end face.

When the off angle $\theta$ of the end face in the cross section is zero, the relation between the off angle $\alpha$ on the end face and the number of round trips of light in the active layer is investigated. FIG. 19 is a drawing schematically showing the relation between the number of round trips of the return light and the off angle α on the end face. When the off angle α is not less than 0.2 degrees, the number of round trips is not more than one. This indicates that, although the resistance to return light is small, the threshold current is made low at the angle θ of zero and the angle α of less than 0.2 degrees. The intensity of the return light is made high at the angle α of not less than 0.2 degrees. In the angle α of not more than 0.5 degrees, increase in threshold current due to the angle α is acceptable for practical use.

Figure 18:
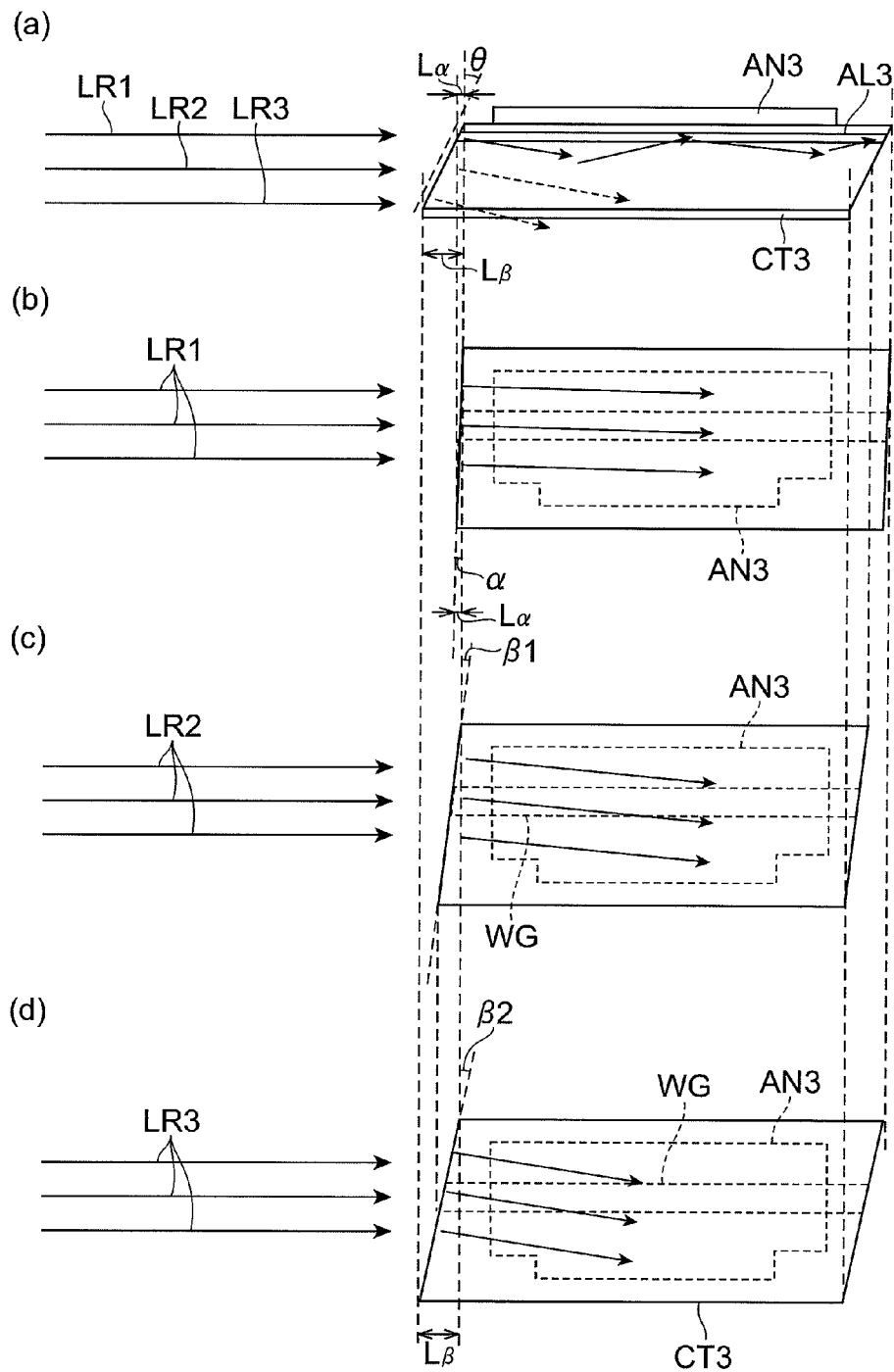
FIG. 18 is a drawing schematically showing influences of light that returns to the III-nitride semiconductor laser device according to the present embodiment.

Explanation is made below on the influence of return light in the nitride semiconductor laser having a fractured face inclined at the angles (θ, α, β), which are explained with reference to FIG. 18. Assuming as follows: in the nitride semiconductor laser for explanation, the longitudinal off angle θ in the end face, the transverse off angle α in the end face of the active layer, and the transverse off angle β in the end face near the back side of the substrate are not zero; the angle α is different from angle β (θ≠0; α≠β≠0). When the substrate thickness T, angle θ and the width of the semiconductor chip W are given, possible ranges of angles α and β are calculated. The transverse angle α of the end face of the active layer is defined as follows:

$$\alpha = \arctan(L_\alpha/W), \text{where } L_\alpha = (\text{Thickness of epitaxial films}) \times \tan(\theta).$$

The transverse angle β of the end face of the substrate is defined as follows:

$$\beta = \arctan(L_\beta/W), \text{where } L_\beta = (\text{Total thickness} = \text{Thickness of epitaxial films} + \text{Thickness of substrate}) \times \tan(\theta).$$

Figure 20:
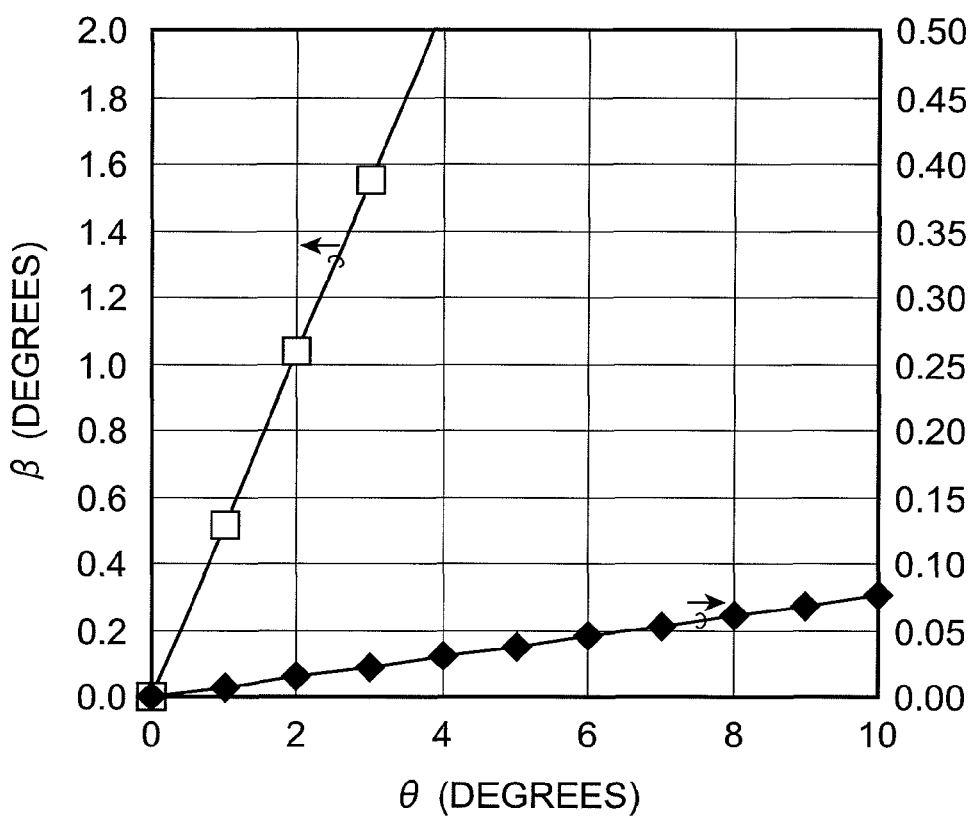
FIG. 20 is a drawing schematically showing the relation between the angle θ and the off angles α and β on the end face, where the substrate thickness T, the angle θ, and the semiconductor chip width W are given.

Typical values are as follows: distance between the active layer and the top of epitaxial films $L1_\alpha = 1$ μm, distance between the active layer and the primary surface of the substrate $L2_\alpha = 2$ μm, the thickness of the epitaxial films $L_\alpha = L1_\alpha + L2_\alpha$; the substrate thickness DSUB=100 μm; the chip width W=200 μm. Then, the dependence as shown in FIG. 20 is obtained. The angle θ is in the range of not more than 10 degrees in which total internal reflection occurs at the interface between the cladding layer and the optical guide layer. In the angle θ=0.4 degrees, α=0.003 degrees and β=0.2 degrees. Therefore, in the angle θ of not less than 0.4 degrees, the angle α is less than 0.2 degrees and the angle β is more than 0.2 degrees. This shows that desired end faces are fabricated. The nitride semiconductor laser having this end face has a high resistance to the disturbance of return light, and enables low threshold current.

Figure 21:
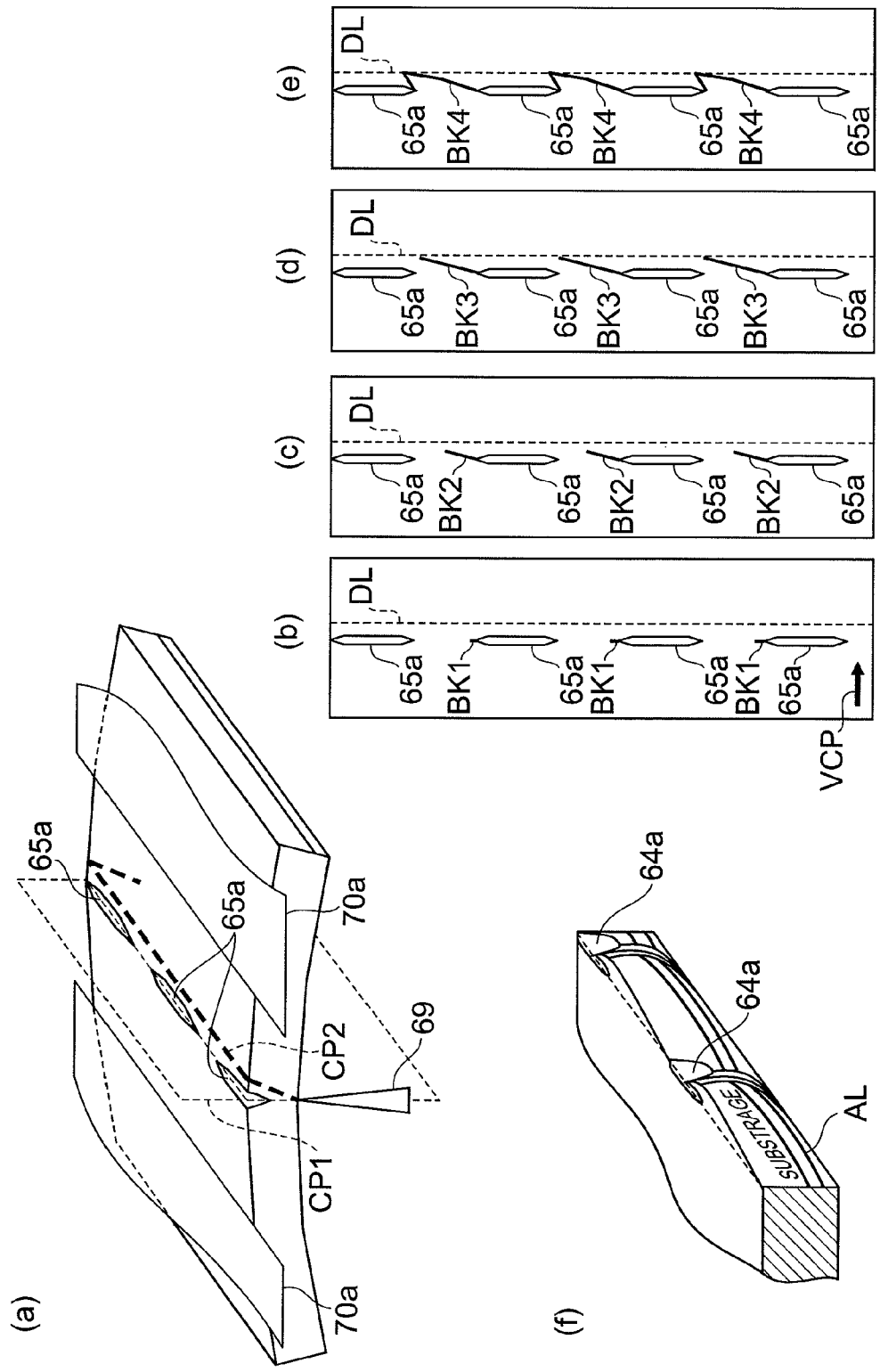
FIG. 21 is a drawing schematically showing the forming process of fracture according to the present embodiment.

Referring to FIG. 21, a method for implementing the formation of the foregoing crystal planes are described below by explaining an example of a semiconductor laser fabricated on a surface of {20-21}. In the nitride semiconductor laser having a waveguide in the direction of the projected c-axis onto the primary surface thereof, a plane perpendicular to the substrate primary surface is referred to as a face CP1 (for example, {-1017} plane) as the end face oriented in the positive direction of the c-axis. In the semiconductor laser fabricated on the surface of {20-21}, however, a face CP2 (for example, {-1016} plane and {10-1-6} plane), which is close to the face CP1, is likely to be formed rather than the face CP1 as a result of the breakup. After forming scribed grooves on the backside of the substrate, breakup of the substrate product is carried out by press against a front surface (epi-surface) of the substrate product, as shown in part (a) of FIG. 21. The dash line DL indicates a {10-1-6} plane located at a line at which a blade is in contact with the epi-surface. As shown in part (b) of FIG. 21, a crack BK1 to initiate fracture originates from a scribed groove. Since a face indicated by plane index {-1016} is formed by the breakup easily rather than a face indicated by plane index {-1017}, a crack BK2 propagates in a direction in which a breakable plane is created, and extends apart from a line along which the scribed grooves are arranged, as shown in part (c) of FIG. 21. As shown in part (d) of FIG. 21, the crack is developed toward the adjacent scribed groove. When the crack BK3 reaches the adjacent scribed groove, a crack BK4 is connected to the adjacent grooves, as shown in part (e) of FIG. 21, to complete the fracture of the substrate product. Since the pressing force is applied to the epi-surface to cause the fracture, a fractured edge on the epi-surface extends along a straight line, whereas a fractured edge on the backside of the substrate is curved. Accordingly, the shape of the end face in the present embodiment can be formed as shown in part (f) of FIG. 21. Embodiments are not limited to the foregoing examples, and the fractured face having the off angles in the predetermined ranges can be formed in the angle range for the semipolar surfaces shown in the foregoing description. In a semiconductor laser formed on a semipolar surface different from the {20-21} plane, after forming the arrangement of scribed grooves extending along the a-n plane in the backside of the substrate, pressing force is applied onto a front surface (epi-surface). A breakable face is created and is close to the line of intersection of the a-n plane and the front surface of the substrate product. As described above, a crack propagates in a direction in which an easily breakable plane is produced.

Figure 22:
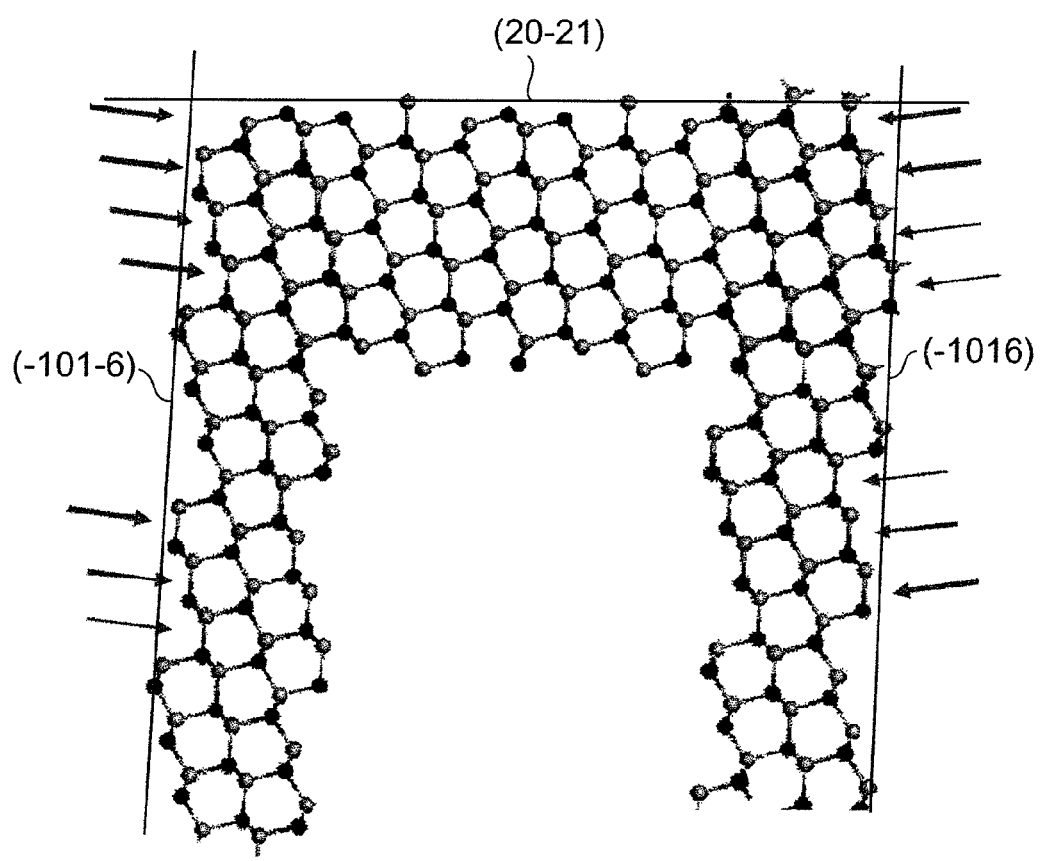
FIG. 22 is a drawing showing atomic arrangements in (20-21) plane, (−101-6) plane, and (−1016) plane.
Figure 23:
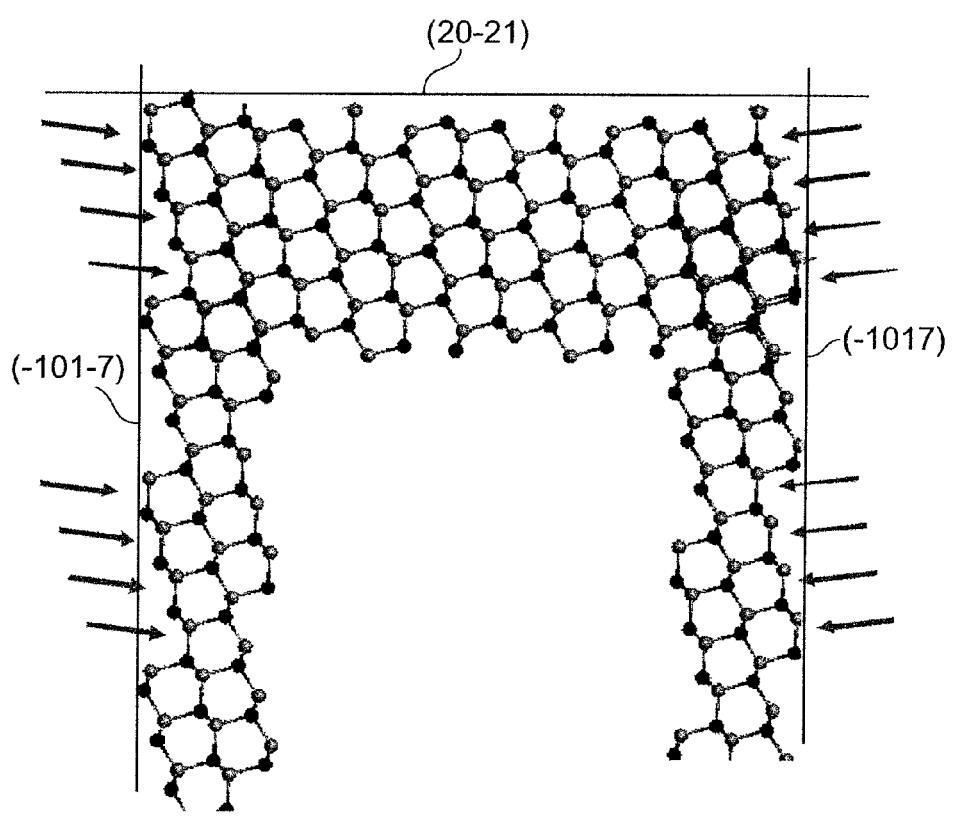
FIG. 23 is a drawing showing atomic arrangements in (20-21) plane, (−101-7) plane, and (−1017) plane.
Figure 24:
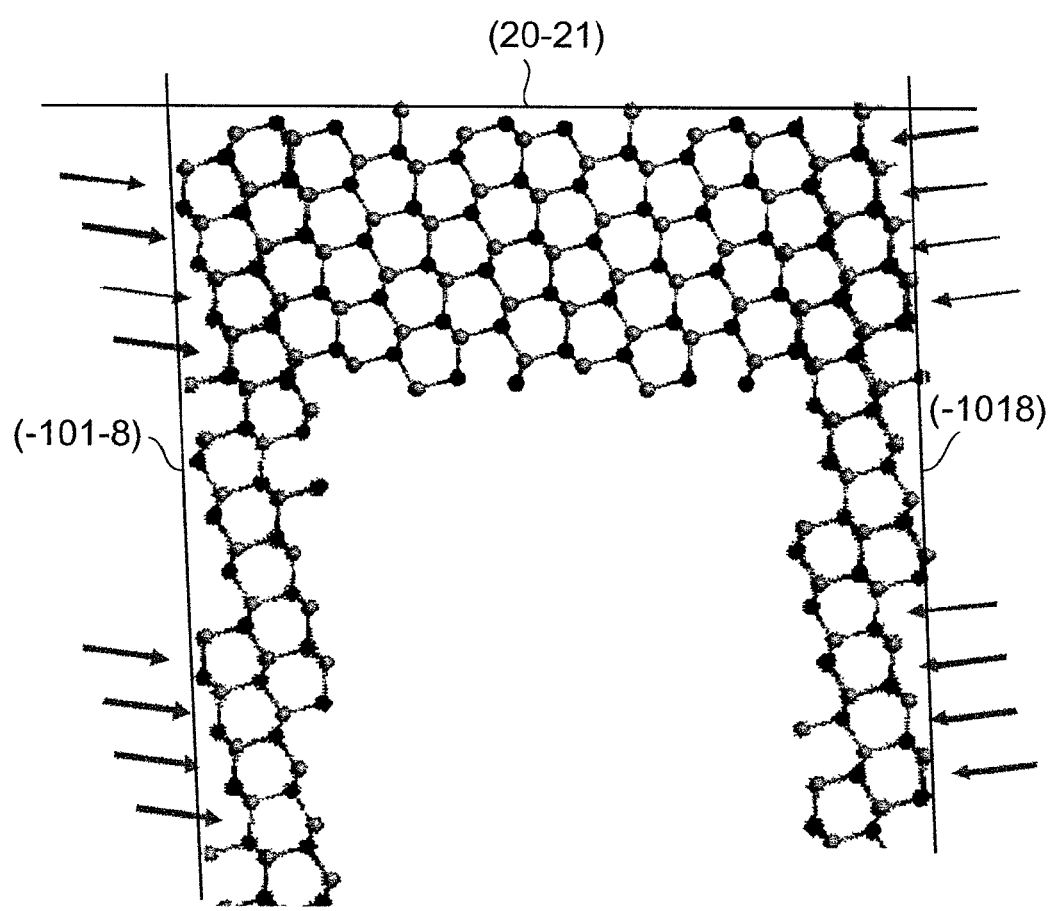
FIG. 24 is a drawing showing atomic arrangements in (20-21) plane, (−101-8) plane, and (−1018) plane.

FIG. 22 is a drawing showing atomic arrangements in the (20-21) plane, (-101-6) plane, and (-1016) plane. FIG. 23 is a drawing showing atomic arrangements in the (20-21) plane, (-101-7) plane, and (-1017) plane. FIG. 24 is a drawing showing atomic arrangements in the (20-21) plane, (-101-8) plane, and (-1018) plane. As shown in FIGS. 21 to 24, local atomic arrangements indicated by arrows show configurations of neutral atoms in terms of charge, and electrically neutral atomic arrangements appear periodically. The reason why the relatively normal faces are obtained to the grown surface can be that generation of fractured faces is considered to be relatively stable because of the periodic appearance of the neutral atomic configurations in terms of charge.

According to various experiments including the above-described Examples 1 to 3, the angle CALPHA can be in the range of not less than 45 degrees and not more than 80 degrees or in the range of not less than 100 degrees and not more than 135 degrees. In order to improve the oscillating chip yield, the angle ALPHA can be in the range of not less than 63 degrees and not more than 80 degrees or in the range of not less than 100 degrees and not more than 117 degrees. The typical semipolar primary surface can be any one of the {20-21} plane, {10-11} plane, {20-2-1} plane, and {10-1-1} plane. Furthermore, the primary surface can be a slight slant surface from these semipolar planes. For example, the semipolar primary surface can be a slight slant surface off in the range of not less than −4 degrees and not more than +4 degrees toward the m-plane from any one of the {20-21} plane, {10-11} plane, {20-2-1} plane, and {10-1-1} plane.

As described above, on the semipolar plane of the support base in which the c-axis of the hexagonal III-nitride is inclined toward the m-axis, the embodiment provides the III-nitride semiconductor laser device with the laser cavity exhibiting the high quality for the cavity mirrors and enabling the low threshold current, in addition to reduction in the disturbance of return light. The embodiment also provides the method for fabricating the III-nitride semiconductor laser device.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method of fabricating a III-nitride semiconductor laser device, the method comprising the steps of:
    preparing a substrate comprised of a hexagonal III-nitride semiconductor and having a semipolar primary surface;
    forming a substrate product having a laser structure, an anode electrode and a cathode electrode, the laser structure including the substrate and a semiconductor region formed on the semipolar primary surface;
    scribing a first surface of the substrate product in part in a direction of an a-axis of the hexagonal III-nitride semiconductor; and
    carrying out breakup of the substrate product by pressing against a second surface of the substrate product, to form another substrate product and a laser bar,
    the first surface being opposite to the second surface,
    the semiconductor region being located between the second surface and the substrate,
    the laser bar having first and second end faces, the first and second end faces extending from the first surface to the second surface, and the first and second end faces being made by the breakup,
    the first and second end faces constituting a laser cavity of the III-nitride semiconductor laser device,
    the anode electrode and the cathode electrode being formed on the laser structure,
    the semiconductor region comprising a first cladding layer comprised of a first conductivity type GaN-based semiconductor, a second cladding layer comprised of a second conductivity type GaN-based semiconductor, and an active layer provided between the first cladding layer and the second cladding layer,
    the first cladding layer, the second cladding layer, and the active layer being arranged along an axis normal to the semipolar primary surface,
    the active layer comprising a GaN-based semiconductor layer,
    a c-axis of the hexagonal III-nitride semiconductor of the substrate being inclined at an angle CALPHA with respect to the normal axis toward an m-axis of the hexagonal III-nitride semiconductor, the angle CALPHA being in one of a range of not less than 45 degrees and not more than 80 degrees and a range of not less than 100 degrees and not more than 135 degrees,
    the first and second end faces intersecting with an m-n plane defined by the normal axis and the m-axis of the hexagonal III-nitride semiconductor,
    the laser structure comprising a laser waveguide on the semipolar primary surface of the substrate, the laser waveguide extending in a direction of a waveguide vector, and the waveguide vector extending in a direction from one of the first and second end faces to another of the first and second end faces,
    the first end face making an angle $\beta$ with a reference plane perpendicular to the waveguide vector in a first plane, the first plane being perpendicular to the m-n plane, and the angle $\beta$ being defined on an end face of the substrate in the first end face,
    the first end face making an angle $\alpha$ with the reference plane in a second plane, the second plane being perpendicular to the m-n plane, and the angle $\alpha$ being defined on an end face of the active layer in the first end face,
    the angle $\alpha$ being different from the angle $\beta$, a sign of the angle $\alpha$ being the same as that of the angle $\beta$, and a difference between the angle $\alpha$ and the angle $\beta$ being not less than 0.1 degrees.

2. The method according to claim 1, wherein the angle $\beta$ is greater than that of the angle $\alpha$.

3. The method according to claim 1, wherein the waveguide vector makes an angle of not less than 0.1 degrees with a normal vector of an a-n plane defined by the normal axis and an a-axis of the hexagonal III-nitride semiconductor.

4. The method according to claim 1, wherein the angle CALPHA is in one of a range of not less than 63 degrees and not more than 80 degrees and a range of not less than 100 degrees and not more than 117 degrees.

5. The method according to claim 1, wherein in the step of forming the substrate product, slicing or grinding of the substrate, is performed such that a thickness of the substrate becomes not more than 400 µm, and the second surface is composed of one of a processed surface made by the processing and a surface including an electrode formed on the processed surface.

6. The method according to claim 1, wherein in the step of forming the substrate product, the substrate is polished such that the substrate has a thickness of not less than 50 µm and not more than 100 µm, and the second surface is composed of one of a polished surface made by the polishing and a surface including an electrode formed on the polished surface.

7. The method according to claim 1, wherein an end face of the active layer in each of the first and second end faces makes an angle in a range of not less than (CALPHA−5) degrees and not more than (CALPHA+5) degrees with respect to a reference plane perpendicular to the m-axis of the substrate of the hexagonal III-nitride semiconductor, and the angle is defined on a plane defined by the c-axis and the m-axis of the hexagonal III-nitride semiconductor.

8. The method according to claim 1, wherein the substrate is comprised of any one of GaN, AlGaN, AlN, InGaN and InAlGaN.

* * * * *